United States Patent
Tanio

(10) Patent No.: US 11,190,204 B2
(45) Date of Patent: Nov. 30, 2021

(54) SECOND-ORDER ΔΣ MODULATOR, RADIO, AND SIGNAL PROCESSING METHOD PERFORMED BY SECOND-ORDER ΔΣ MODULATOR

(71) Applicant: NEC Corporation, Tokyo (JP)

(72) Inventor: Masaaki Tanio, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 16/769,177

(22) PCT Filed: Dec. 4, 2018

(86) PCT No.: PCT/JP2018/044534
§ 371 (c)(1),
(2) Date: Jun. 2, 2020

(87) PCT Pub. No.: WO2019/111884
PCT Pub. Date: Jun. 13, 2019

(65) Prior Publication Data
US 2021/0218413 A1  Jul. 15, 2021

(30) Foreign Application Priority Data

Dec. 4, 2017  (JP) .............................. JP2017-232802

(51) Int. Cl.
*H03M 3/00* (2006.01)
*H03K 5/01* (2006.01)
(Continued)

(52) U.S. Cl.
CPC .............. *H03M 3/436* (2013.01); *H03K 5/01* (2013.01); *H03K 19/21* (2013.01); *H04B 1/04* (2013.01);
(Continued)

(58) Field of Classification Search
CPC ........... H03K 5/01; H03K 19/21; H03M 3/00; H03M 3/02; H03M 3/04; H03M 3/39;
(Continued)

(56) References Cited

U.S. PATENT DOCUMENTS 7,786,914 B2 *  8/2010  Madoglio ........... H03M 7/3004
                                                    341/143
9,735,801 B1 *  8/2017  Miki ........................ H03M 3/42
(Continued)

FOREIGN PATENT DOCUMENTS

| JP | H06-318149 | 11/1994 |
| JP | 2011-077741 | 4/2011 |

(Continued)

OTHER PUBLICATIONS

Tanio, Masaaki et al., "An FPGA-based All-Digital Transmitter with 28-GHz Time-Interleaved Delta-Sigma Modulation," IEEE IMS Symposium, May 2016 (4 pages).
(Continued)

*Primary Examiner* — Shawkat M Ali

(57) ABSTRACT

A second-order ΔΣ modulator includes: a two-stage integrator; a first arithmetic operation circuit; and a second arithmetic operation circuit. The two-stage integrator includes a plurality of adder arrays, each of which includes a plurality of adders. The plurality of adder arrays includes first to fourth adder arrays. An output of a last stage of the second adder array is fed back as an input of a first stage of the first adder array. An output of a last stage of the fourth adder array is fed back as an input of a first stage of the third adder array. A sum bit string obtained in the first adder array is input to the third adder array. A sum bit string obtained in the second adder array is input to the fourth adder array.

7 Claims, 18 Drawing Sheets

(51) Int. Cl.
    H03K 19/21    (2006.01)
    H04B 1/04     (2006.01)
    H04B 1/16     (2006.01)
    H03K 5/00     (2006.01)

(52) U.S. Cl.
    CPC ..... *H04B 1/16* (2013.01); *H03K 2005/00078* (2013.01)

(58) Field of Classification Search
    CPC .......... H03M 3/46; H03M 3/436; H03M 7/36; H04B 1/04; H04B 1/16; H04L 27/12
    USPC .............. 341/76, 77, 143; 375/219, 295–297
    See application file for complete search history.

(56) References Cited

U.S. PATENT DOCUMENTS

| | | | | |
|---|---|---|---|---|
| 2007/0241951 A1* | 10/2007 | Neubauer | ........... | H03M 7/3015 341/143 |
| 2009/0109076 A1 | 4/2009 | Jalan | | |
| 2017/0077946 A1* | 3/2017 | Christen | ............... | H03M 3/328 |
| 2018/0248724 A1 | 8/2018 | Tanio et al. | | |

FOREIGN PATENT DOCUMENTS

WO   WO-2017-037880   3/2017
WO   WO-2018-101467   6/2018

OTHER PUBLICATIONS

Tanio, Masaaki et al., "An FPGA-based All Digital Transmitter with 9.6-GHz 2nd order Time-Interleaved Delta-Sigma Modulation for 500-MHz bandwidth," IEEE IMS Symposium, pp. 149-152, Jun. 2017.

Tanio, Masaaki et al., "An FPGA-based 1-bit Digital Transmitter with 800 MHz Bandwidth for 5G Millimeter-wave Active Antenna Systems," IEEE MTT-S IMS Symposium, pp. 499-502, Jun. 2018.

International Search Report corresponding to PCT/JP2018/044534 dated Feb. 19, 2019 (5 pages).

Japanese Notice of Allowance for JP Application No. 2019-558220 dated Aug. 31, 2021 with English Translation.

* cited by examiner

SECOND-ORDER ΔΣ MODULATOR, RADIO, AND SIGNAL PROCESSING METHOD PERFORMED BY SECOND-ORDER ΔΣ MODULATOR

CROSS REFERENCE TO RELATED APPLICATIONS

This application is a national stage application of International Application No. PCT/JP2018/044534 entitled "SECOND-ORDER ΔΣ MODULATOR, RADIO, AND SIGNAL PROCESSING METHOD PERFORMED BY SECOND-ORDER ΔΣ MODULATOR," filed on Dec. 4, 2018 which claims the benefit of the priority of Japanese Patent Application No. JP-2017-232802, filed on Dec. 4, 2017, the disclosures of each of which are hereby incorporated by reference in their entirety.

TECHNICAL FIELD

The present invention relates to a second-order ΔΣ modulator, a radio, and a signal processing method performed by a second-order ΔΣ modulator.

BACKGROUND ART

In wireless communication, the effective use of various frequency bands is required. Accordingly, wireless devices that support various frequencies are sought. Frequency-independent 1-bit digital transmitters, which use a ΔΣ modulator or the like, are being studied as a transmitter that supports various frequencies.

Patent Document 1 discloses, as a related technique, a technique that relates to increasing the speed of first-order ΔΣ modulation.

Non-Patent Document 1 discloses, as a related technique, a technique that relates to increasing the speed of first-order ΔΣ modulation.

Non-Patent Document 2 discloses, as a related technique, a technique that relates to increasing the speed of second-order ΔΣ modulation.

PRIOR ART DOCUMENTS

Patent Document

[Patent Document 1] PCT International Publication No. WO 2017/037880

Non-Patent Documents

[Non-Patent Document 1] Masaaki Tanio, Shinichi Hori, Noriaki Tawa, Tomoyuki Yamase, and Kazuaki Kunihiro, "An FPGA-based All-Digital Transmitter with 28-GHz Time-Interleaved Delta-Sigma Modulation", IEEE IMS Symp, pp. 1-4, MAY 2016.

[Non-Patent Document 2] Masaaki Tanio, Shinichi Hori, Noriaki Tawa and Kazuaki Kunihiro, "An FPGA-based All-Digital Transmitter with 9.6-GHz 2nd order Time-Interleaved Delta-Sigma Modulation for 500-MHz bandwidth", IEEE IMS Symp, pp. 149-152, JUNE 2017.

SUMMARY OF THE INVENTION

Problem to be Solved by the Invention

Incidentally, it is considered that, as a means of increasing the speed of second-order ΔΣ modulation, the technique described in Non-Patent Document 1 may be applied to arithmetic operations of low-order bits described in Non-Patent Document 2.

In this case, for example, the configuration shown in FIG. 18 can be regarded as a processing unit that performs second-order ΔΣ modulation. Furthermore, FIG. 19 shows a processing time chart of the processing unit shown in FIG. 18, which performs second-order ΔΣ modulation. In the configuration shown in FIG. 18, a preceding stage TI-accumulator realizes parallel operation using a parity arithmetic operation unit. On the other hand, regarding the subsequent stage, it is not possible to perform arithmetic operations in parallel. As a result, it is necessary for all arithmetic operations of N full adders (where N corresponds to the number of time-interleaved channels), which correspond to the second-stage TI-accumulator, to be completed within a single clock. This places a limitation on the operation clock.

That is to say, even when the technique described in Non-Patent Document 1 and the technique described in Non-Patent Document 2 are combined, the extent to which the speed can be increased is limited.

Therefore, a technique that enables arithmetic operations to be performed at high speeds in a second-order ΔΣ modulator is sought.

An example object of the aspects of the present invention is, for example, to provide a second-order ΔΣ modulator, a radio, and a signal processing method performed by a second-order ΔΣ modulator that solve the problems described above.

Means for Solving the Problem

According to an example aspect of the present invention, a second-order ΔΣ modulator includes a two-stage integrator, a first arithmetic operation unit, and a second arithmetic operation unit. The two-stage integrator includes a plurality of adder arrays, each of which includes a plurality of adders. The plurality of adder arrays includes first to fourth adder arrays. An output of a last stage of the second adder array is fed back as an input of a first stage of the first adder array. An output of a last stage of the fourth adder array is fed back as an input of a first stage of the third adder array. A sum bit string obtained in the first adder array is input to the third adder array. A sum bit string obtained in the second adder array is input to the fourth adder array. The first arithmetic operation unit performs an arithmetic operation based on inputs supplied to the plurality of adders of the first adder array, and inputs an arithmetic operation result to the second adder array. The second arithmetic operation unit performs an arithmetic operation based on the inputs supplied to the plurality of adders of the first adder array and inputs supplied to the plurality of adders of the third adder array, and inputs an arithmetic operation result to the fourth adder array.

According to a second example aspect of the present invention, a radio includes: a transmitter including the above-mentioned second-order ΔΣ modulator; and a receiver that demodulates a signal modulated by another radio that includes a transmitter similar to the transmitter.

According to a third example aspect of the present invention, a signal processing method performed by a second-order ΔΣ modulator is a signal processing method performed by a second-order ΔΣ modulator, the second-order ΔΣ modulator including a two-stage integrator, a first arithmetic operation unit, and a second arithmetic operation unit, the two-stage integrator including a plurality of adder arrays that include first to fourth adder arrays, each of which including a plurality of adders, the method including: feeding back an output of a last stage of the second adder array as an input of a first stage of the first adder array; feeding back an output of a last stage of the fourth adder as an input of a first stage of the third adder array; inputting a sum bit string obtained in the first adder array to the third adder array; inputting a sum bit string obtained in the second adder array to the fourth adder array; performing an arithmetic operation based on inputs supplied to the plurality of adders of the first adder array to input an arithmetic operation result to the second adder array, by the first arithmetic operation unit; and performing an arithmetic operation based on the inputs supplied to the plurality of adders of the first adder array and inputs supplied to the plurality of adders of the third adder array to input an arithmetic operation result to the fourth adder array, by the second arithmetic operation unit.

Effects of the Invention

According to example aspects of the present invention, operations can be performed at high speeds in a second-order $\Delta\Sigma$ modulator.

EXAMPLE EMBODIMENTS FOR CARRYING OUT THE INVENTION

First Example Embodiment

Hereunder, example embodiments of the present invention will be described with reference to the drawings.

Figure 1:
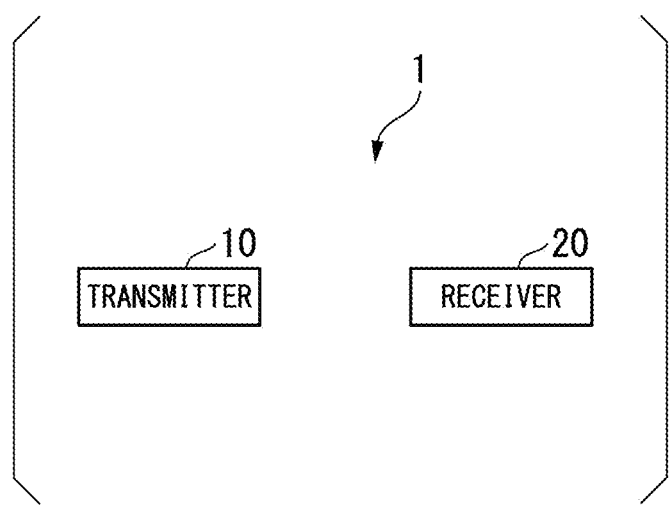
FIG. 1 is a diagram showing a configuration of a radio according to a first example embodiment of the present invention.

As shown in FIG. 1, a radio 1 according to a first example embodiment of the present invention includes a transmitter 10 and a receiver 20. The transmitter 10 includes a second-order $\Delta\Sigma$ modulator, and is a transmitter that performs high-speed arithmetic operations by decomposing a signal to be modulated into a plurality of adder arrays, and then performing signal processing.

Figure 2:
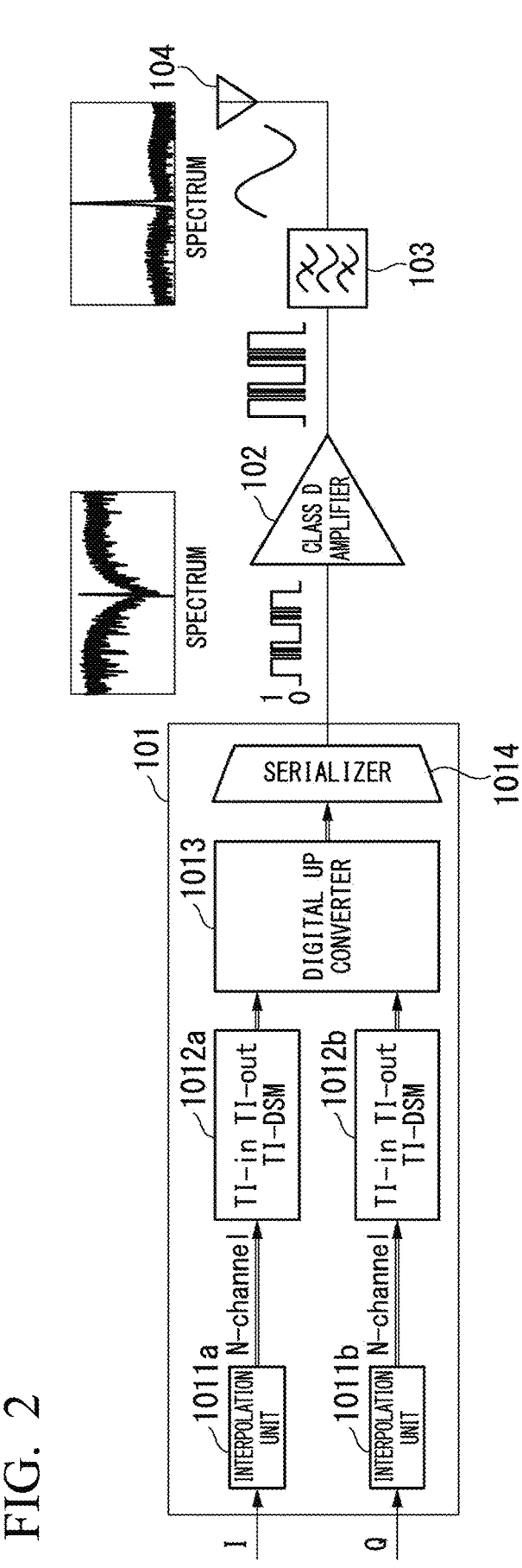
FIG. 2 is a diagram showing a configuration of a transmitter according to the first example embodiment of the present invention.

As shown in FIG. 2, the transmitter 10 includes a digital modulator 101, a class D amplifier 102, a band pass filter 103, and an antenna 104.

The digital modulator 101 is a second-order $\Delta\Sigma$ modulator that receives an I-signal and a Q-signal as inputs, and generates a binary pulse train. The digital modulator 101 outputs the generated binary pulse train to the class D amplifier 102.

The class D amplifier 102 receives the binary pulse train from the digital modulator 101. The class D amplifier 102 amplifies the binary pulse train while maintaining its pulse pattern. The class D amplifier 102 outputs the amplified binary pulse train to the band pass filter 103.

The band pass filter 103 receives the amplified binary pulse train from the class D amplifier 102. The band pass filter 103 removes frequency components other than the desired band (which is near the carrier frequency) from the received binary pulse train, and generates an RF signal. The band pass filter 103 outputs the RF signal to the antenna 104.

The antenna 104 receives the RF signal from the band pass filter 103. The antenna 104 transmits the received RF signal to the outside of the transmitter 10.

Next, the digital modulator 101 will be described.

As shown in FIG. 2, the digital modulator 101 includes interpolation units 1011a and 1011b, TI (time interleaved)-$\Delta\Sigma$ modulation units (TI-DSM in FIGS. 2) 1012a and 1012b, a digital up converter 1013, and a serializer 1014.

The interpolation units 1011a and 1011b each perform oversampling of the I-signal and the Q-signal. The interpolation units 1011a and 1011b each take N oversampled signals as a single set, and output in parallel the N signals grouped as a single set to the subsequent TI-$\Delta\Sigma$ modulation units 1012a and 1012b. Here N corresponds to the number of time interleaved channels in the subsequent TI-$\Delta\Sigma$ modulation units 1012a and 1012b.

The TI-$\Delta\Sigma$ modulation units 1012 and 1012b each execute $\Delta\Sigma$ modulation in which time interleaving of N channels is performed, and output an N-channel signal.

The digital up converter 1013 performs digital up-conversion with respect to the received IQ 1-bit signal sequences. The digital up converter 1013 converts the 2N data obtained by merging the N data of each of the digitally up-converted I data and Q data into a single set of the bit signal sequence. The digital up converter 1013 outputs the single set of the bit signal sequence to the serializer 1014.

The serializer 1014 converts the single set of the bit signal sequence, which includes 2N data, into a high-speed 1-bit signal by parallel-serial conversion. Specifically, when the frequency of the bit signal sequence at the stage before the serializer 1014 is M, the frequency output by the serializer 1014 becomes "M×2N".

Next, an operation of the TI-ΔΣ modulation units 1012a and 1012b will be described.

Figure 3:
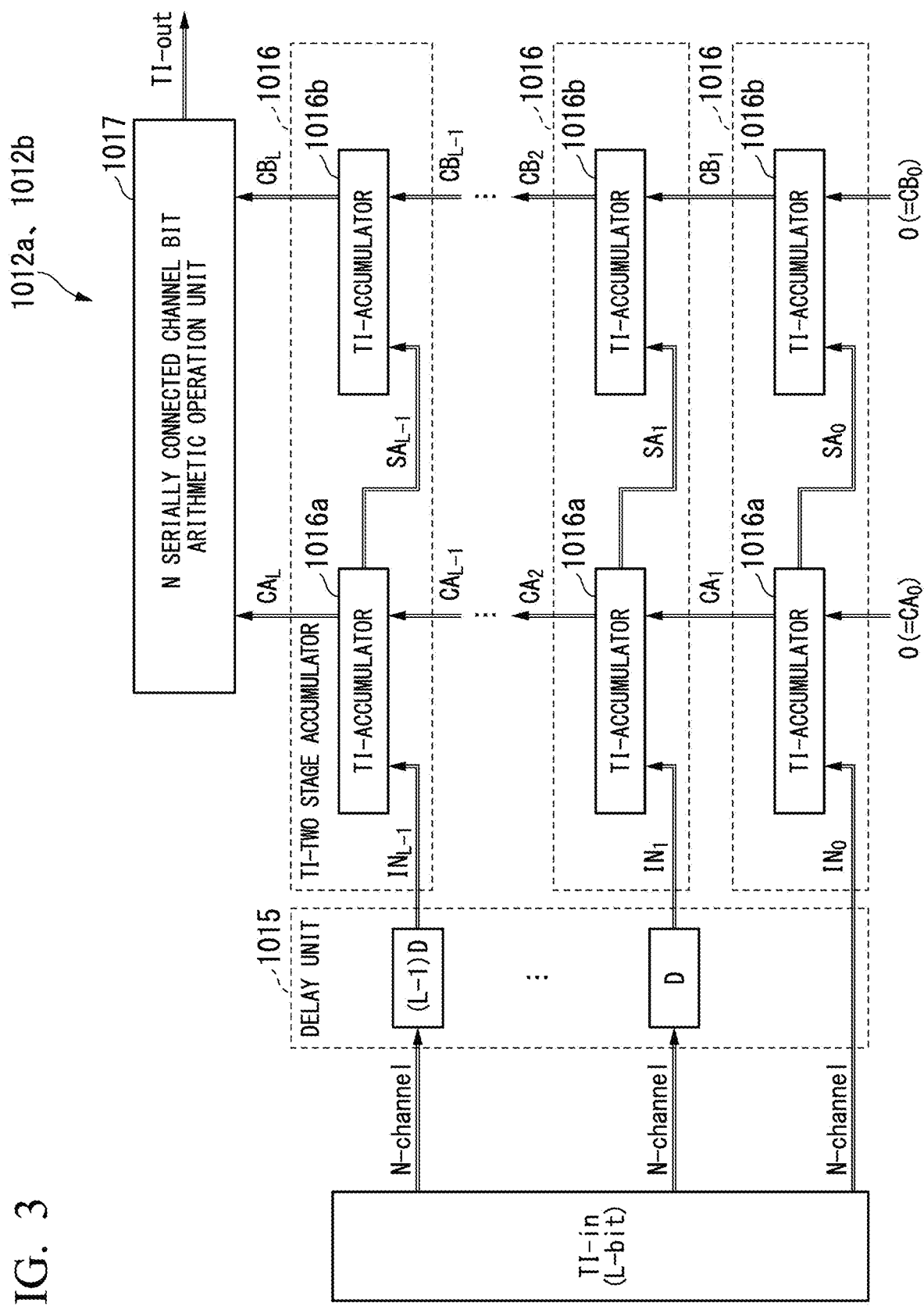
FIG. 3 is a diagram showing a configuration of a TI-$\Delta\Sigma$ modulation unit according to the first example embodiment of the present invention.

As shown in FIG. 3, each of the TI-ΔΣ modulation units 1012a and 1012b includes a delay unit 1015, L TI-two stage accumulators 1016, and an N serially connected channel bit arithmetic operation unit 1017.

The delay unit 1015 delays a bit signal sequence of L digits and N channels by a different time for each digit. The delay unit 1015 outputs the delayed N-channel bit signal sequence to the plurality of TI-two stage accumulators 1016. At this time, the delay amount added by the delay unit 1015 is successively increased from the lowest digit by a single unit (indicated by "D" in FIG. 3), which is at least the propagation delay amount necessary for operation of the TI-two stage accumulators 1016. As a result, it is possible to negate the influence of the propagation delay amount generated in the TI-two stage accumulators 1016, and it is possible to achieve overall synchronization.

The TI-two stage accumulators 1016 each include TI-accumulators 1016a and 1016b. The TI-two stage accumulators 1016 each have a hierarchical structure so that a TI-in signal, which is an input signal, is processed digit by digit.

Hereunder, a TI-two stage accumulator 1016 in the ith level (where i is an integer from 0 to (L−1)) will be described.

The TI-accumulator 1016a receives as inputs an N-channel input signal $IN_i$, which is output from the delay unit 1015, and an N-channel carry bit $CA_i$. The TI-accumulator 1016a performs an arithmetic operation on the input signals $IN_i$ and the carry bits $CA_i$, and outputs an N-channel carry bit $CA_{i+1}$ and an N-channel sum bit $SA_i$. The TI-accumulator 1016a outputs the N-channel sum bit $SA_i$ to the TI-accumulator 1016b. That is to say, the TI-accumulator 1016a is a preceding stage TI-accumulator. Furthermore, the TI-accumulator 1016b is a subsequent stage TI-accumulator. The carry bits $CA_i$ become the input signals of the TI-accumulator 1016a of the TI-two stage accumulator 1016 in the (i+1)th level.

The TI-accumulator 1016b receives as inputs the N-channel sum bit $SA_i$, which is an output of the TI-accumulator 1016a, and an N-channel carry bit $CB_i$. The TI-accumulator 1016b performs an arithmetic operation on the input sum bits $SA_i$ and carry bits $CB_i$, and outputs an N-channel carry bit $CB_{i+1}$. The carry bits $CB_i$ become the input signals of the TI-accumulator 1016b of the TI-two stage accumulator 1016 in the (i+1)th level The N serially connected channel bit arithmetic operation unit 1017 receives the output signals $CA_L$ and $CB_L$ of the TI-two stage accumulator 1016 in the (L−1)th level. The N serially connected channel bit arithmetic operation unit 1017 performs an arithmetic operation on the received signals $CA_L$ and $CB_L$, and outputs an N-channel bit signal sequence TI-out. This processing is the same as that described in Non-Patent Document 2. Therefore, a detailed description is omitted.

Hereunder, the TI-two stage accumulator 1016 will be described in more detail.

Figure 4:
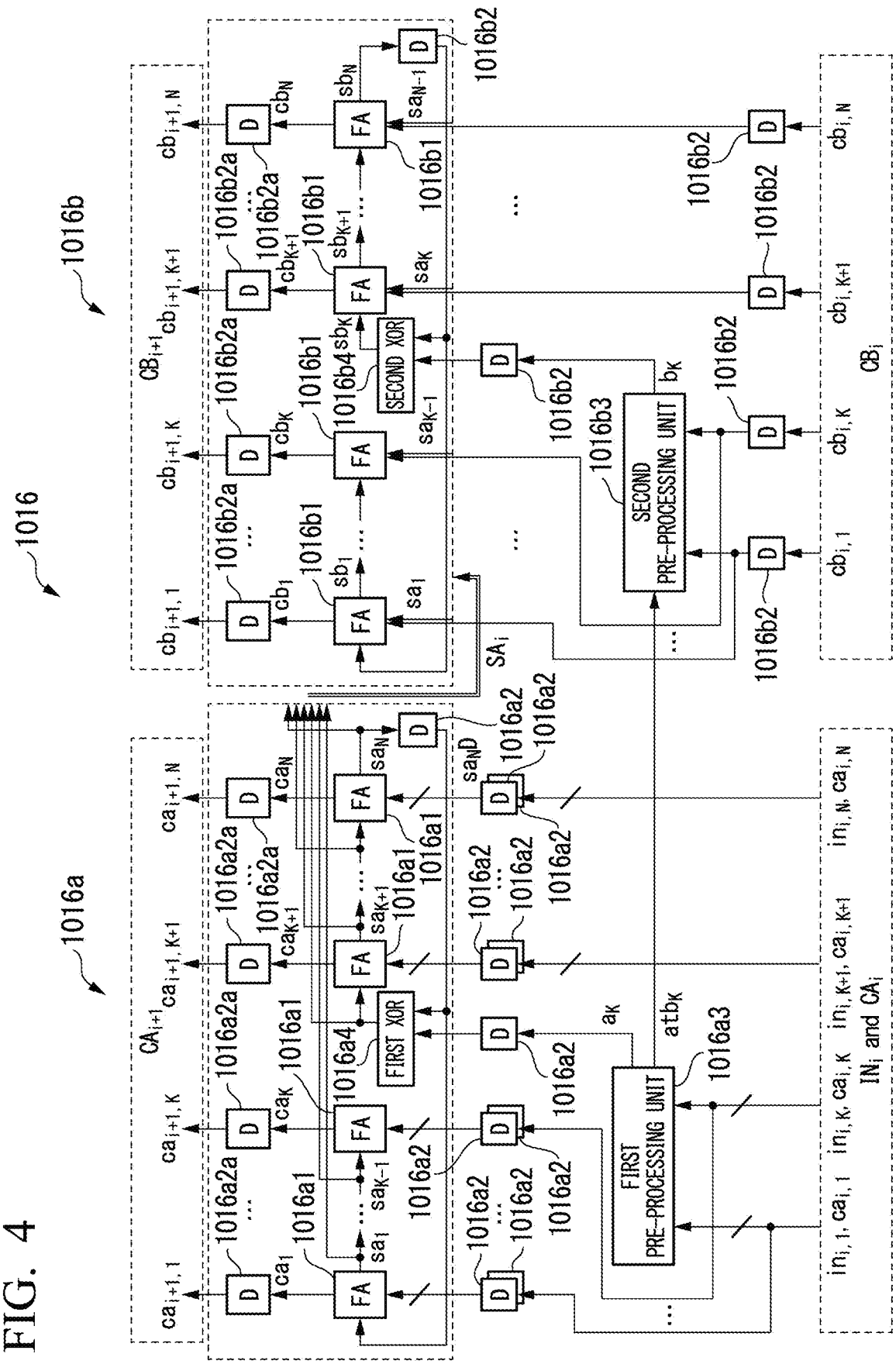
FIG. 4 is a diagram showing a configuration of a TI-two stage accumulator according to the first example embodiment of the present invention.

As shown in FIG. 4, the TI-accumulator 1016a includes N FAs (Full Adders) 1016a1, (3N+2) delay elements (D) 1016a2, a first pre-processing unit 1016a3 (an example of a first arithmetic operation unit), and a first XOR unit 1016a4 (an example of a first arithmetic operation unit).

The TI-accumulator 1016b includes N FAs 1016b1, (2N+2) delay elements (D) 1016b2, a second pre-processing unit 1016b3 (an example of a second arithmetic operation unit), and a second XOR unit 1016b4 (an example of a second arithmetic operation unit).

First, the TI-accumulator 1016a shown in FIG. 4 will be described.

As shown in FIG. 4, the N FAs 1016a1 included in the TI-accumulator 1016a are configured by two FA 1016a1 arrays in which the sum bits of the FAs 1016a1 are serially connected. Indexes 1 to N are assigned to the respective FAs 1016a1, which correspond to the indexes of the inputs to the FAs 1016a1. The first FA 1016a1 array is configured by FAs 1016a1 having the indexes 1 to K. The second FA 1016a1 array is configured by FAs 1016a1 having the indexes (K+1) to N. In the first example embodiment of the present invention, a description will be given of a radio 1 that splits signals to which even-numbered indexes are assigned and performs arithmetic operation processing in parallel. A radio 1 that splits signals to which odd-numbered indexes are assigned and performs arithmetic operation processing in parallel will be described in a third example embodiment of the present invention.

The delay elements (D) 1016a2 are, for example, D latches. Among the delay elements (D) 1016a2, N delay elements (D) 1016a2a delay each of the carry bits ($ca_1$ to $ca_N$) obtained as a result of an arithmetic operation by the FAs 1016a1. Furthermore, the N delay elements (D) 1016a2a delay the input signals ($IN_1$ to $IN_N$). The N delay elements (D) 1016a2a output the delayed bits as an N-channel carry signal $CA_{i+1}$, and input the signal to the TI-two stage accumulator 1016 in the upper level. One of the delay elements (D) 1016a2a delays the output of the first pre-processing unit 1016a3, and the output is then used as an input signal of the first XOR unit 1016a4.

The sum bit output ($sa_N$) of the last-stage FA 1016a1 (index N) is delayed by a delay element (D) 1016a2, and the output is then used as an input signal of the first XOR unit 1016a4 and an input signal of the first-stage FA 1016a1 (index 1).

In this manner, the TI-accumulator 1016a receives as inputs an N-channel input signal $IN_i=[in_{i,1}, in_{i,2}, \ldots, in_{i,N}]$ and an N-channel carry signal $CA_i=[ca_{i,1}, ca_{i,2}, \ldots, ca_{i,N}]$. These 2N bits are delayed by one clock by the 2N delay elements (D) 1016a2, and are then each input to the N FAs 1016a1.

The N FAs 1016a1 carry out a full addition with respect to the three input signals, and output carry bits and sum bits. The N sum bits ($sa_1$ to $sa_N$) are bundled as the sum bits $SA_i$, and then input to the TI-accumulator 1016b.

Among the input signals, the input signals to which the first-half of indexes from 1 to K (where K is an integer greater than or equal to 1 and less than N) are assigned are used as the input signals of the first pre-processing unit 1016a3.

Next, the first pre-processing unit 1016a3 and the second pre-processing unit 1016b3 will be described.

Figure 5:
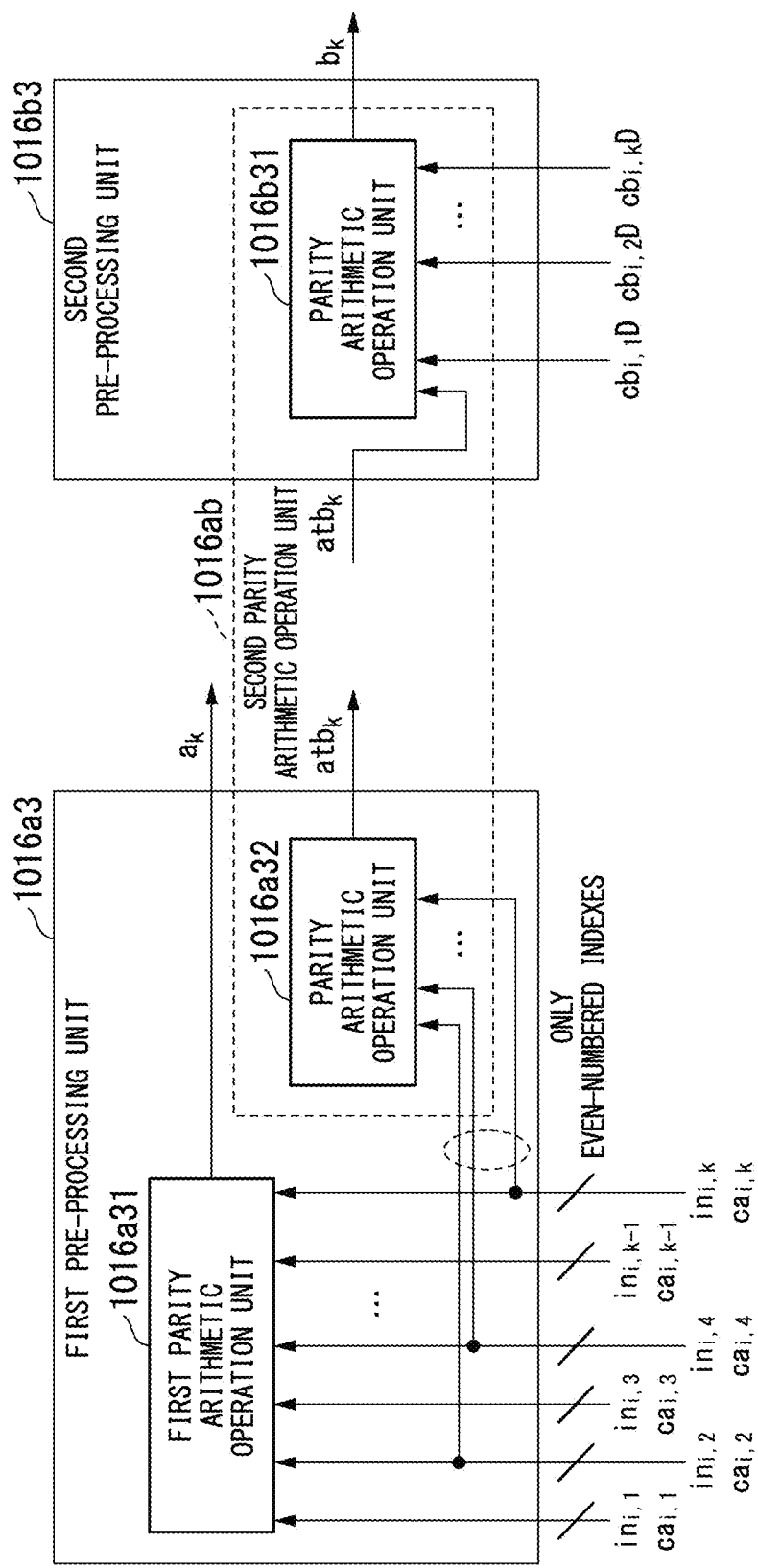
FIG. 5 is a diagram showing a configuration of a first pre-processing unit and a second pre-processing unit according to the first example embodiment of the present invention.

As shown in FIG. 5, the first pre-processing unit $1016a3$ includes a first parity arithmetic operation unit $1016a31$ and a parity arithmetic operation unit $1016a32$.

As shown in FIG. 5, the second pre-processing unit $1016b3$ includes a parity arithmetic operation unit $1016b31$.

The parity arithmetic operation unit $1016a32$ and the parity arithmetic operation unit $1016b31$ constitute a second parity arithmetic operation unit $1016ab$.

The first pre-processing unit $1016a3$ receives as inputs the 2K bits $in_{i,1}, in_{i,2}, \ldots, in_{i,K}, ca_{i,1}, ca_{i,2}, \ldots, ca_{i,K}$, and outputs two bits ($a_K$ and $atb_K$). The first parity arithmetic operation unit $1016a31$ performs a parity arithmetic operation with respect to the input 2K bits, and outputs an arithmetic operation result as a single bit ($a_K$). The output $a_K$ of the first parity arithmetic operation unit $1016a31$ is delayed by a delay element (D) $1062a2$ as described above, and then input to the first XOR unit $1016a4$.

The input of the first parity arithmetic operation unit $1016a31$ does not have to use all of the 2K bits as described above. Specifically, when the interpolation units $1011a$ and $1011b$ use a zero-order hold when performing oversampling, there are cases where consecutive bits have the same values, such as when $in_{i,1}=in_{i,2}, in_{i,3}=in_{i,4}, \ldots, in_{i,K-1}=in_{i,K}$. In this case, the parity of the K bits ($in_{i,1}, in_{i,2}, \ldots, in_{i,K}$) is zero regardless of their values. Consequently, the input of these K bits ($in_{i,1}, in_{i,2}, \ldots, in_{i,K}$) can be omitted, such that the input bits become the K bits of $ca_{i,1}, ca_{i,2}, \ldots, ca_{i,K}$. Such a configuration where the first parity arithmetic operation unit $1016a31$ performs an arithmetic operation while omitting K bits of the input is also included in example embodiments of the present invention.

The first XOR unit $1016a4$ performs an XOR arithmetic operation with respect to two input signals (a delayed signal of the output of the first parity arithmetic operation unit $1016a31$ and a delayed signal of the output of the last-stage FA $1016a1$). The first XOR unit $1016a4$ outputs an arithmetic operation result to the FA $1016a1$ having the index (K+1) to which it is serially connected.

The parity arithmetic operation unit $1016a32$ performs a parity arithmetic operation using, among the 2K bits described above, K bits to which even-numbered indexes ($in_{i,2}, in_{i,4}, \ldots, in_{i,K}, ca_{i,2}, ca_{i,4}, \ldots, ca_{i,K}$) are assigned. The parity arithmetic operation unit $1016a32$ outputs an arithmetic operation result as a single bit ($atb_K$). The output $atb_K$ of the parity arithmetic operation unit $1016a32$ is input to the second pre-processing unit $1016b3$.

Next, the TI-accumulator $1016b$ shown in FIG. 4 will be described.

As shown in FIG. 4, the N FAs $1016b1$ included in the TI-accumulator $1016b$ are, in the same manner as the TI-accumulator $1016a$, configured by two FA $1016b1$ arrays in which the sum bits of the FAs $1016b1$ are serially connected. Indexes 1 to N are assigned to the respective FAs $1016b1$, which correspond to the indexes of the inputs to the FAs $1016b1$. The first FA $1016b1$ array is configured by FAs $1016b1$ having indexes 1 to K. The second FA $1016b1$ array is configured by FAs $1016b1$ having indexes (K+1) to N.

The delay elements (D) $1016b2$ are, for example, D latches. Among these, N delay elements (D) $1016b2a$ delay each of the carry bits ($ca_1$ to $ca_N$) obtained as a result of an arithmetic operations by the FAs $1016b1$. The N delay elements (D) $1016b2$ output the delayed bits as an N-channel carry signal $CA_{i+1}$ and input the signal to the TI-two stage accumulator $1016$ in the upper level. One of the delay elements (D) $1016b2a$ delays the output of the second pre-processing unit $1016b3$, and the signal is then used as an input signal of the second XOR unit $1016b4$.

The sum bit output ($sa_N$) of the last-stage FA $1016b1$ (index N) is delayed by a delay element (D) $1016b2$, and the output is then used as an input signal of the second XOR unit $1016b4$ and an input signal of the first-stage FA $1016b1$ (index 1).

The TI-accumulator $1016a$ receives as inputs an N-channel sum bit signal $SA_i=[sa_{i,1}, sa_{i,2}, \ldots, sa_{i,N}]$ and an N-channel carry signal $CB_i=[cb_{i,1}, cb_{i,2}, \ldots, cb_{i,N}]$. Among these 2N bits, the sum bit signals $SA_i$ are each input to the N FAs $1016b1$. Furthermore, among the 2N bits, the carry signals $CB_i$ are delayed by one clock by the N delay elements (D) $1016b2$ as mentioned above, and are then each input to the N FAs $1016b1$ as the signals $cb_{i,1}D, cb_{i,2}D, \ldots, cb_{i,N}D$.

The N FAs $1016b1$ carry out a full addition with respect to the three input signals, and output carry bits and sum bits.

Among the input signals, the input signals to which the first-half of indexes from 1 to K (where K is an integer greater than or equal to 1 and less than N) are assigned are used as the input signals of the second pre-processing unit $1016b3$.

In the second pre-processing unit $1016b3$, the parity arithmetic operation unit $1016b31$ performs a parity arithmetic operation using (K+1) bits ($atb_K, cb_{i,1}D, cb_{i,2}D, \ldots, cb_{i,K}D$) as input signals. The parity arithmetic operation unit $1016b31$ outputs an arithmetic operation result as a single bit ($b_K$).

The output $b_K$ of the parity arithmetic operation unit $1016b31$ is delayed by a delay element (D) $1062b2$ as described above, and then input to the second XOR unit $1016b4$.

The second XOR unit $1016b4$ performs an XOR arithmetic operation with respect to two input signals (a delayed signal of the output of the parity arithmetic operation unit $1016b31$ and a delayed signal of the output of the last-stage FA $1016b1$). The second XOR unit $1016b4$ outputs an arithmetic operation result to the FA $1016a1$ having the index (K+1) to which it is serially connected.

The parity arithmetic operation unit $1016a32$ and the parity arithmetic operation unit $1016b31$ can also be combined into a single second parity arithmetic operation unit $1016ab$. In this case, the input signals are the 2K bits $in_{i,2}, in_{i,4}, \ldots, in_{i,K}, ca_{i,2}, ca_{i,4}, \ldots, ca_{i,K}, cb_{i,1}, cb_{i,2}, \ldots, cb_{i,K}$. The second parity arithmetic operation unit $1016ab$ obtains an output $b_K$ by performing a parity arithmetic operation with respect to the 2K bits.

Figure 6:
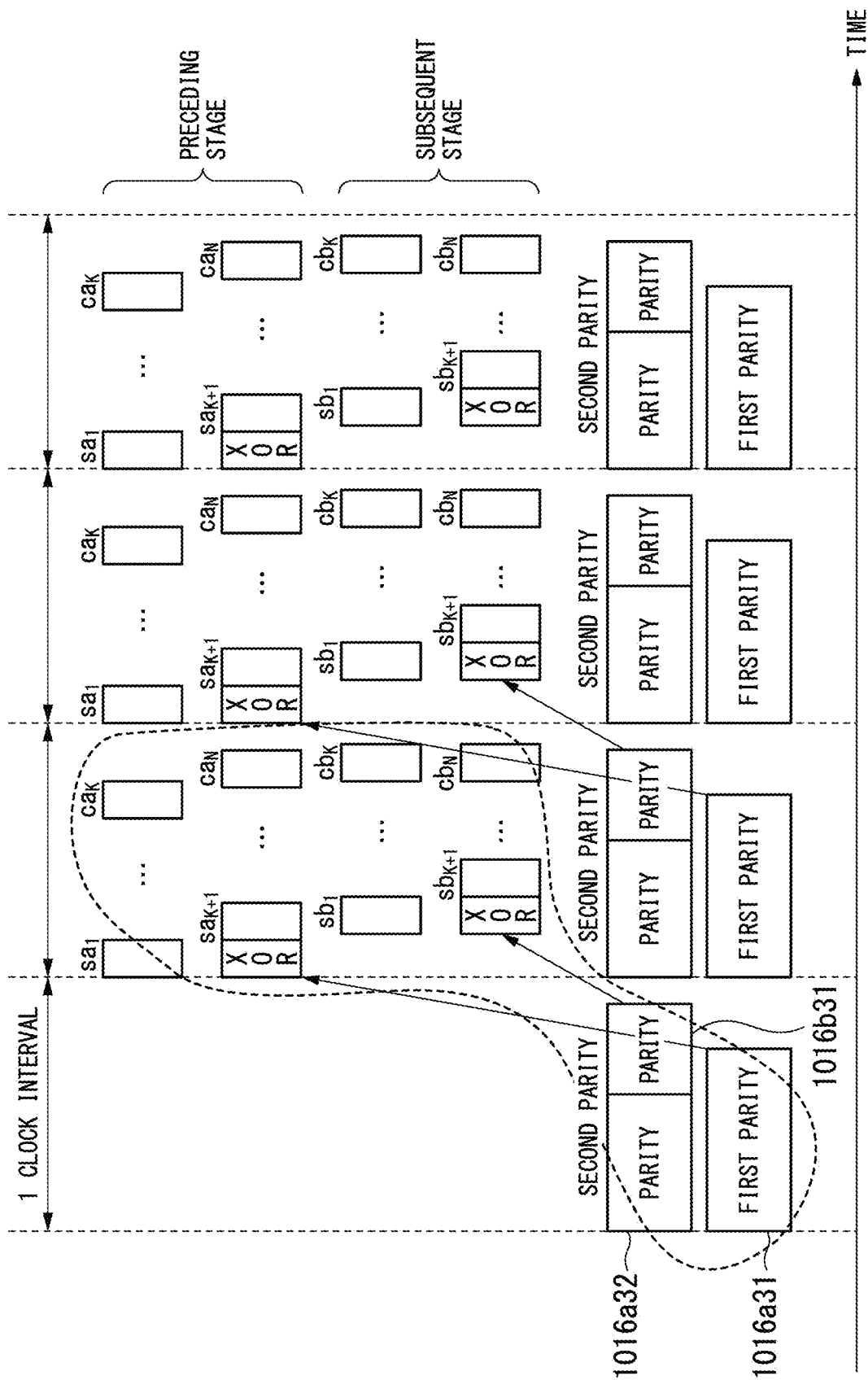
FIG. 6 is a time chart showing an operation of a digital modulator according to the first example embodiment of the present invention.

FIG. 6 is a time chart showing an operation of the digital modulator 101. Hereunder, the time chart shown in FIG. 6 will be described.

On the first clock, the output $a_K$ of the first parity arithmetic operation unit $1016a31$ and the output $atb_K$ of the parity arithmetic operation unit $1016a32$ are obtained. Furthermore, the output $b_K$ of the parity arithmetic operation unit $1016b31$ is obtained using the output $atb_K$.

On the second clock, the output $a_K$ obtained on the first clock is input to the first XOR unit $1016a4$. As a result, the sum bit $sa_K$ corresponding to the input of the (K+1)th FA $1016a1$ of the TI-accumulator $1016a$ is obtained. Consequently, in the TI-accumulator $1016a$, the FAs $1016a1$ (first to Kth, and (K+1)th to Nth) are capable of performing a parallel arithmetic operation.

Furthermore, the output $b_K$ of the parity arithmetic operation unit $1016b31$ obtained on the first clock is input to the second XOR unit $1016b4$. As a result, the second XOR unit $1016b4$ outputs the sum bit $sb_K$ to the FA $1016b1$ having the index (K+1). Consequently, in the TI-accumulator $1016b$, the FAs 1016*a*2 (first to Kth, and (K+1)th to Nth) are capable of performing a parallel arithmetic operation.

The radio 1 according to the first example embodiment of the present invention has been described above.

In the radio 1, the digital modulator 101 includes the first pre-processing unit 1016*a*3, which performs an arithmetic operation on the basis of inputs supplied to the plurality of adders of a first adder array (an adder array configured by the FAs 1016*a*1 to which the indexes 1 to K are assigned). The digital modulator 101 includes the first XOR unit 1016*a*4, which performs an arithmetic operation on the basis of an arithmetic operation result of the first pre-processing unit 1016*a*3 and an output of a second adder array (an adder array configured by the FAs 1016*a*1 to which the indexes (K+1) to N are assigned), and inputs an arithmetic operation result to the second adder array. It includes the second pre-processing unit 1016*b*3, which performs an arithmetic operation on the basis of inputs supplied to the plurality of adders of the first adder array and inputs supplied to the plurality of adders of a third adder array (an adder array configured by the FAs 1016*b*1 to which the indexes 1 to K are assigned). The digital modulator 101 includes the second XOR unit 1016*b*4, which performs an arithmetic operation on the basis of an arithmetic operation result of the second pre-processing unit 1016*b*3 and an output of a fourth adder array (an adder array configured by the FAs 1016*b*1 to which the indexes (K+1) to N are assigned), and inputs an arithmetic operation result to the fourth adder array.

As a result of the digital modulator 101 being configured in this manner, the radio 1 according to the first example embodiment of the present invention is capable of splitting a target signal of an arithmetic operation, and performing arithmetic processing in parallel. This enables arithmetic operations to be performed at high speeds.

Second Example Embodiment

In a similar manner to the radio 1 according to the first example embodiment of the present invention, the radio 1 according to a second example embodiment of the present invention includes a transmitter 10 and a receiver 20. The transmitter 10 is a transmitter that includes a second-order ΔΣ modulator, and performs high-speed arithmetic operations by decomposing a signal to be modulated into a plurality of adder arrays, and then performing signal processing.

The radio 1 according to the second example embodiment of the present invention is a radio that divides the arithmetic operations performed in the second parity arithmetic operation unit 1016*b*, which performs the most arithmetic operations in the radio 1 according to the first example embodiment of the present invention. As a result of dividing the arithmetic operations performed in the second parity arithmetic operation unit 1016*ab*, which performs the most arithmetic operations, the radio 1 according to the second example embodiment of the present invention is capable of operating at higher speeds compared to the radio 1 according to the first example embodiment of the present invention.

Figure 7:
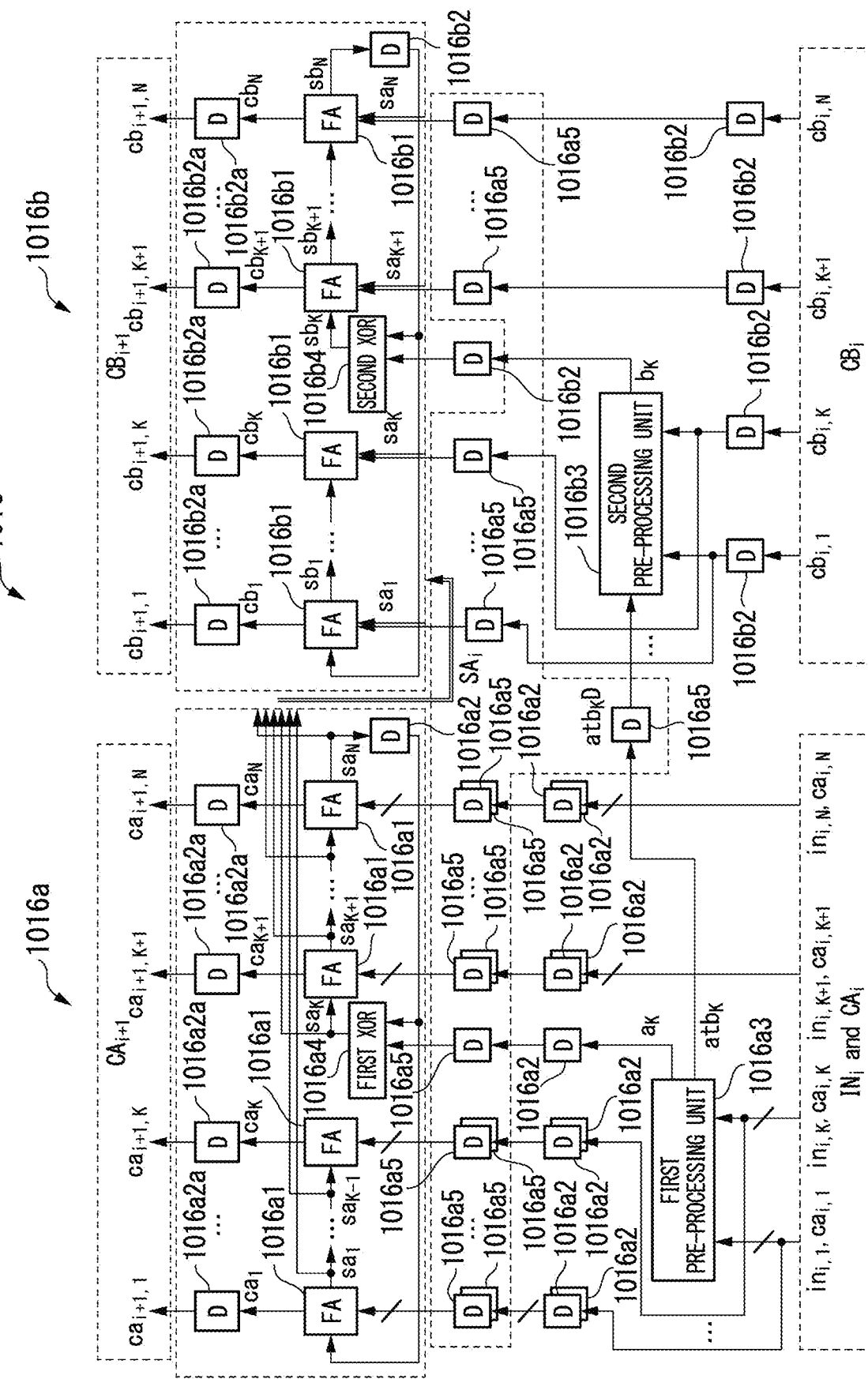
FIG. 7 is a diagram showing a configuration of a radio according to a second example embodiment of the present invention.

As shown in FIG. 7, the radio 1 according to the second example embodiment of the present invention includes, in addition to the radio 1 according to the first example embodiment of the present invention, (3N+2) delay elements (D) 1016*a*5.

The (3N+2) delay elements (D) 1016*a*5 are provided between the parity arithmetic operation unit 1016*a*32 and the parity arithmetic operation unit 1016*b*31. Therefore, the delay elements (D) 1016*a*5 enable the parity arithmetic operation unit 1016*a*32 and the parity arithmetic operation unit 1016*b*31 to each perform arithmetic operations at different clock timings, and the amount of arithmetic operation required in a single clock is reduced.

Here, if the delay elements (D) 1016*a*5 are simply provided between the parity arithmetic operation unit 1016*a*32 and the parity arithmetic operation unit 1016*b*31, the synchronization in another block will be lost, resulting in inaccurate arithmetic operations. Therefore, additional delay elements (D) 1016*a*5 are added to the other block. This enables the inside of the second parity arithmetic operation unit 1016*ab* to be divided without losing the synchronization in the other block, and reduces the amount of arithmetic operations required in a single clock. The delay elements (D) 1016*a*5 are, for example, D latches.

The first pre-processing unit 1016*a*3 according to the second example embodiment of the present invention includes a first parity arithmetic operation unit 1016*a*31 and a parity arithmetic operation unit 1016*a*32. A third parity arithmetic operation unit 1016*ab*2 is configured by the parity arithmetic operation unit 1016*a*32 shown in FIG. 8, and a parity arithmetic operation unit (not shown) that corresponds to the parity arithmetic operation unit 1016*b*31 in FIG. 5.

Figure 8:
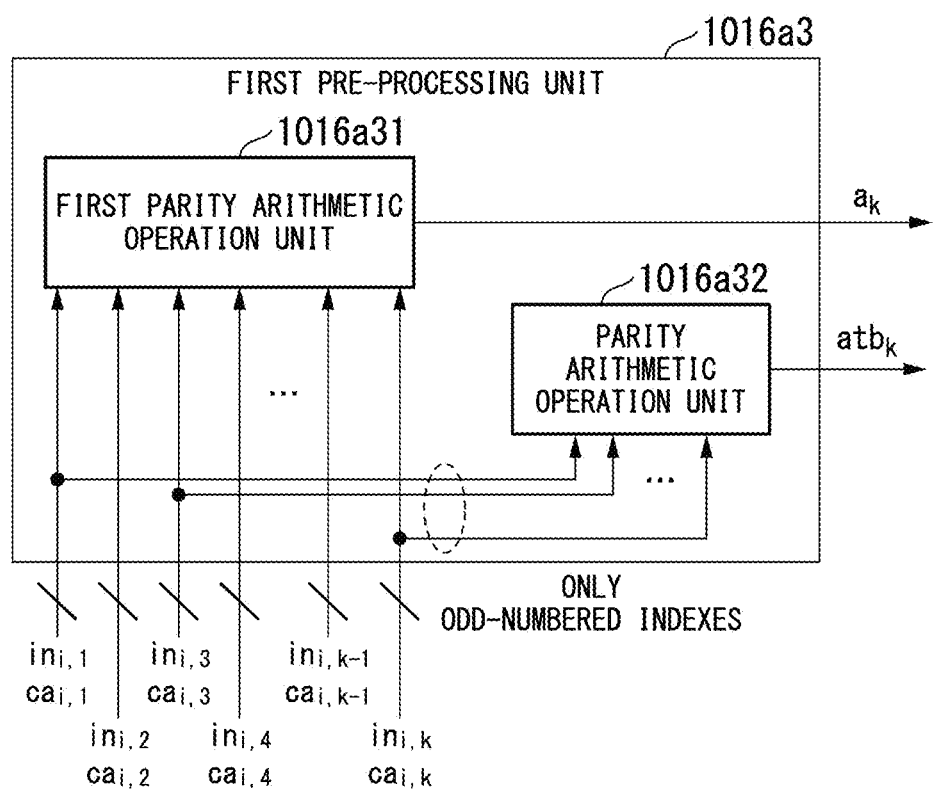
FIG. 8 is a diagram showing a configuration of a first pre-processing unit according to the second example embodiment of the present invention.

The first parity arithmetic operation unit 1016*a*31 receives, as inputs, signals to which odd-numbered indexes are assigned, performs a parity arithmetic calculation, and outputs an arithmetic operation result as a single bit ($a_K$). The parity arithmetic operation unit 1016*a*32 receives, as inputs, signals to which odd-numbered indexes are assigned, performs a parity arithmetic calculation, and outputs an arithmetic operation result as a single bit ($atb_K$). The first pre-processing unit 1016*a*3 performs an arithmetic operation using the even-numbered indexes when K is an even number, and performs an arithmetic operation using the odd-numbered indexes when K is an odd number. Therefore, depending on the value of K, there are cases where the configuration shown in FIG. 5 is adopted, and cases where the configuration shown in FIG. 8 is adopted.

Figure 9:
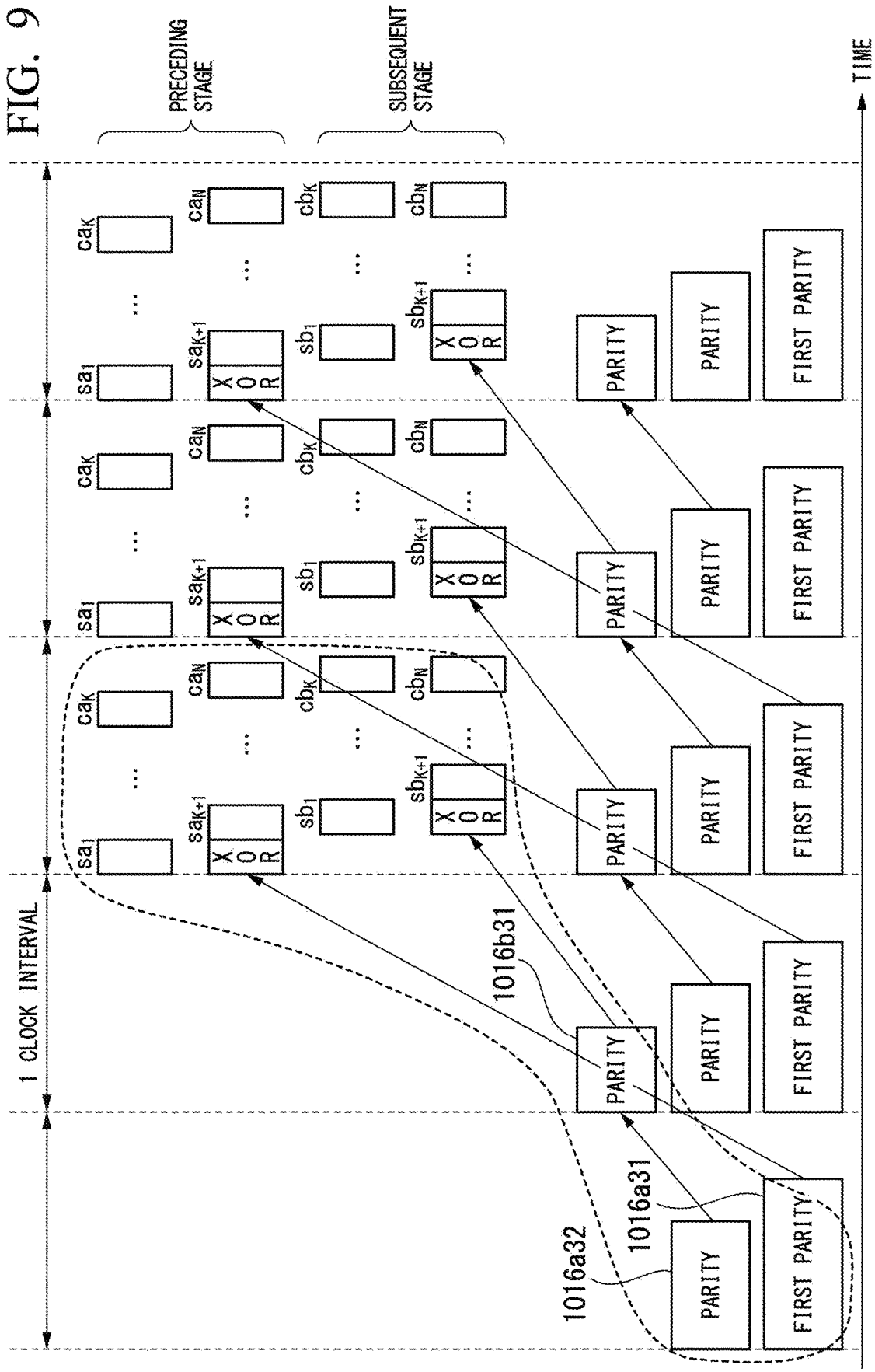
FIG. 9 is a time chart showing an operation of a digital modulator according to the second example embodiment of the present invention.

FIG. 9 is a time chart showing an operation of the digital modulator 101. Hereunder, the time chart shown in FIG. 9 will be described.

On the first clock, the first parity arithmetic operation unit 1016*a*31 and the parity arithmetic operation unit 1016*a*32 execute a parity arithmetic operation in parallel, and the output $a_K$ of the first parity arithmetic operation unit 1016*a*31 and the output $atb_K$ of the parity arithmetic operation unit 1016*a*32 are respectively obtained.

On the second clock, the parity arithmetic operation unit 1016*b*31 performs a parity arithmetic operation with respect to the output $atb_K$ of the first parity arithmetic operation unit 1016*a*32 obtained on the first clock. Further, in parallel with the parity arithmetic operation by the parity arithmetic operation unit 1016*b*31, the first parity arithmetic operation unit 1016*a*31 and the parity arithmetic operation unit 1016*a*32 execute a parity operation with respect to the signals input on the second clock.

Then, on the third clock, in a similar manner to the case of the first example embodiment of the present invention shown in FIG. 6, the TI-accumulator 1016*a* and the TI-accumulator 1016*b* each execute a parity arithmetic operation in parallel with respect to the output $a_K$ of the first parity arithmetic operation unit 1016*a*31 obtained on the first clock, and the output $b_K$ of the parity arithmetic operation unit 1016*b*31 obtained on the second clock.

In the radio 1 according to the second example embodiment of the present invention, although a disadvantage exists in that the latency increases due to the addition of the delay elements (D) 1016$a$5, the amount of arithmetic operation required in a single clock is reduced relative to the radio 1 according to the first example embodiment of the present invention. Therefore, the radio 1 according to the second example embodiment of the present invention is capable of performing communication at higher speeds than the radio 1 according to the first example embodiment of the present invention.

The radio 1 according to the second example embodiment of the present invention has been described above.

In the radio 1, the digital modulator 101 includes a first delay element (a delay element (D) 1016$a$2 connected to the output of the FA 1016$a$1 to which the index N is assigned), which delays an output of the second adder array. The digital modulator 101 includes a second delay element (a delay element (D) 1016$b$2 connected to the output of the FA 1016$b$1 to which the index N is assigned), which delays an output of the fourth adder array. The digital modulator 101 includes the first pre-processing unit 1016$a$3, which performs an arithmetic operation on the basis of inputs supplied to the plurality of adders of the first adder array. The digital modulator 101 includes a third delay element (a delay element (D) 1016$a$2 provided between the first pre-processing unit 1016$a$3 and the first XOR unit 1016$a$4), which delays an arithmetic operation result output by the first pre-processing unit 1016$a$3. It includes the first XOR unit 1016$a$4 which performs an arithmetic operation on the basis of an output of the third delay element and an output of the first delay element, and inputs an arithmetic operation result to the second adder array. The digital modulator 101 includes the second pre-processing unit 1016$b$3, which performs an arithmetic operation on the basis of inputs supplied to the plurality of adders of the first adder array. The digital modulator 101 includes a fourth delay element (a delay element (D) 1016$b$5 provided between the first pre-processing unit 1016$a$3 and the second pre-processing unit 1016$b$3), which delays an arithmetic operation result output by the second pre-processing unit 1016$b$3. The digital modulator 101 includes the second XOR unit 1016$b$4, which performs an arithmetic operation on the basis of an output of the fourth delay element and inputs supplied to the plurality of adders of the third adder array. The digital modulator 101 includes a fifth delay element (a delay element (D) 1016$b$2 provided between the second pre-processing unit 1016$b$3 and the second XOR unit 1016$b$4), which delays an arithmetic operation result output by the second pre-processing unit 1016$b$3. The digital modulator 101 includes the second XOR unit 1016$b$4, which performs an arithmetic operation on the basis of an output of the fifth delay element and an output of the second delay element, and inputs an arithmetic operation result to the fourth adder array.

As a result of the digital modulator 101 being configured in this manner, the radio 1 according to the second example embodiment of the present invention is capable of splitting a signal which is processed by the first pre-processing unit 1016$a$3, and performing arithmetic operation processing in parallel in the second pre-processing unit 1016$b$3. This enables arithmetic operations to be performed at higher speeds than in the radio 1 according to the first example embodiment of the present invention.

Third Example Embodiment

In a similar manner to the radio 1 according to the first example embodiment of the present invention, the radio 1 according to a third example embodiment of the present invention includes a transmitter 10 and a receiver 20. The transmitter 10 is a transmitter that includes a second-order ΔΣ modulator, and performs high-speed arithmetic operations by decomposing a signal to be modulated into a plurality of adder arrays and performing signal processing.

In the first example embodiment of the present invention, a description has been given of a radio 1 in which signals to which even-numbered indexes are assigned are split and subjected to arithmetic operation processing in parallel. In the third example embodiment of the present invention, a description will be given of a radio 1 in which signals to which odd-numbered indexes are assigned are split and subjected to arithmetic operation processing in parallel.

The radio 1 according to the third example embodiment of the present invention differs from the radio 1 according to the first example embodiment of the present invention in the following two points.

Figure 10:
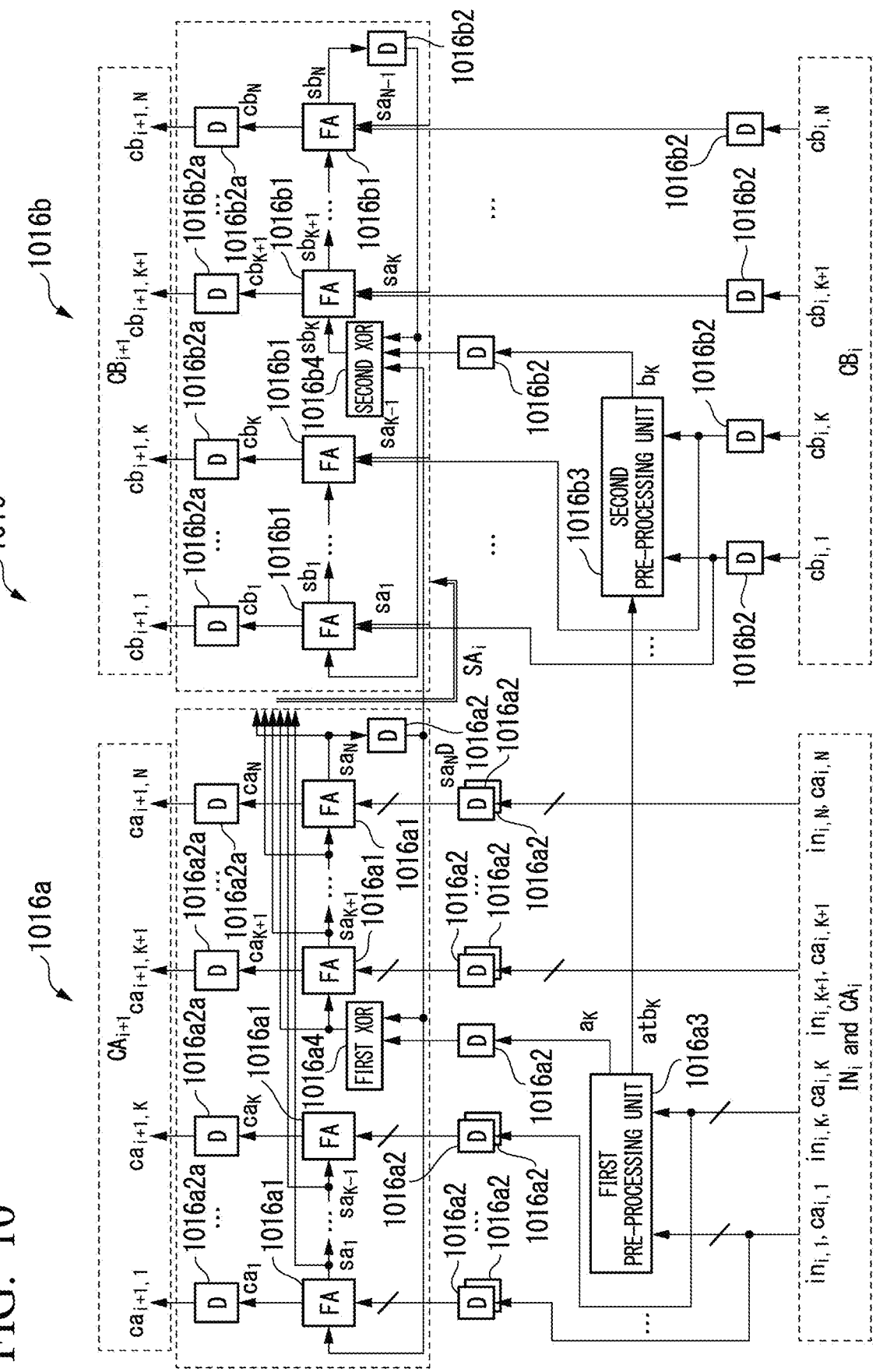
FIG. 10 is a diagram showing a configuration of a radio according to a third example embodiment of the present invention.

The first point is that, as shown in FIG. 10, in the radio 1 according to the third example embodiment of the present invention, the output signal $sa_N$ of the delay element (D) 1016$a$2 that delays the output of the last-stage FA 1016$a$1 of the TI-accumulator 1016$a$ is input to the second XOR unit 1016$b$4.

The second point is that the radio 1 according to the third example embodiment of the present invention delays the signals to which odd-numbered indexes ($in_{i,1}$, $in_{i,3}$, . . . , $in_{i,K}$, $ca_{i,1}$, $ca_{i,3}$, . . . , $ca_{i,K}$) are assigned, and performs a parity arithmetic operation with respect to the signals.

The radio 1 according to the third example embodiment of the present invention is obtained by applying the points of difference described above to the radio 1 according to the first example embodiment of the present invention. In the radio 1 according to the third example embodiment of the present invention, the TI-accumulator 1016$a$ and the TI-accumulator 1016$b$ are capable of performing an arithmetic operation in parallel when the signals to which odd-numbered indexes are assigned are split.

The radio 1 according to the third example embodiment of the present invention has been described above.

In the radio 1, the digital modulator 101 includes the first pre-processing unit 1016$a$3, which performs an arithmetic operation on the basis of inputs supplied to the plurality of adders of the first adder array. The digital modulator 101 includes the first XOR unit 1016$a$4, which performs an arithmetic operation on the basis of an arithmetic operation result of the first pre-processing unit 1016$a$3 and an output of the second adder array, and inputs an arithmetic operation result to the second adder array. The digital modulator 101 includes the second pre-processing unit 1016$b$3, which performs an arithmetic operation on the basis of inputs supplied to the plurality of adders of the first adder array, and inputs supplied to the plurality of adders of the third adder array. The digital modulator 101 includes the second XOR unit 1016$b$4, which performs an arithmetic operation on the basis of an arithmetic operation result of the second pre-processing unit 1016$b$3, an output of the fourth adder array, and an output of the second adder array, and inputs an arithmetic operation result to the fourth adder array.

As a result of the digital modulator 101 being configured in this manner, the radio 1 according to the second example embodiment of the present invention is capable of splitting signals to which odd-numbered indexes ($in_{i,1}$, $in_{i,3}$, . . . , $in_{i,K}$, $ca_{i,1}$, $ca_{i,3}$, . . . , $ca_{i,K}$) are assigned, and performing arithmetic processing in parallel. This enables arithmetic operations to be performed at high speeds.

Fourth Example Embodiment

In a similar manner to the radio 1 according to the first example embodiment of the present invention, the radio 1 according to a fourth example embodiment of the present invention includes a transmitter 10 and a receiver 20. The transmitter 10 is a transmitter that includes a second-order ΔΣ modulator, and performs high-speed arithmetic operations by decomposing a signal to be modulated into a plurality of adder arrays and performing signal processing.

The radio 1 according to the fourth example embodiment of the present invention is a radio in which the TI-accumulator 1016a and the TI-accumulator 1016b execute three arithmetic operations in parallel.

Figure 11:
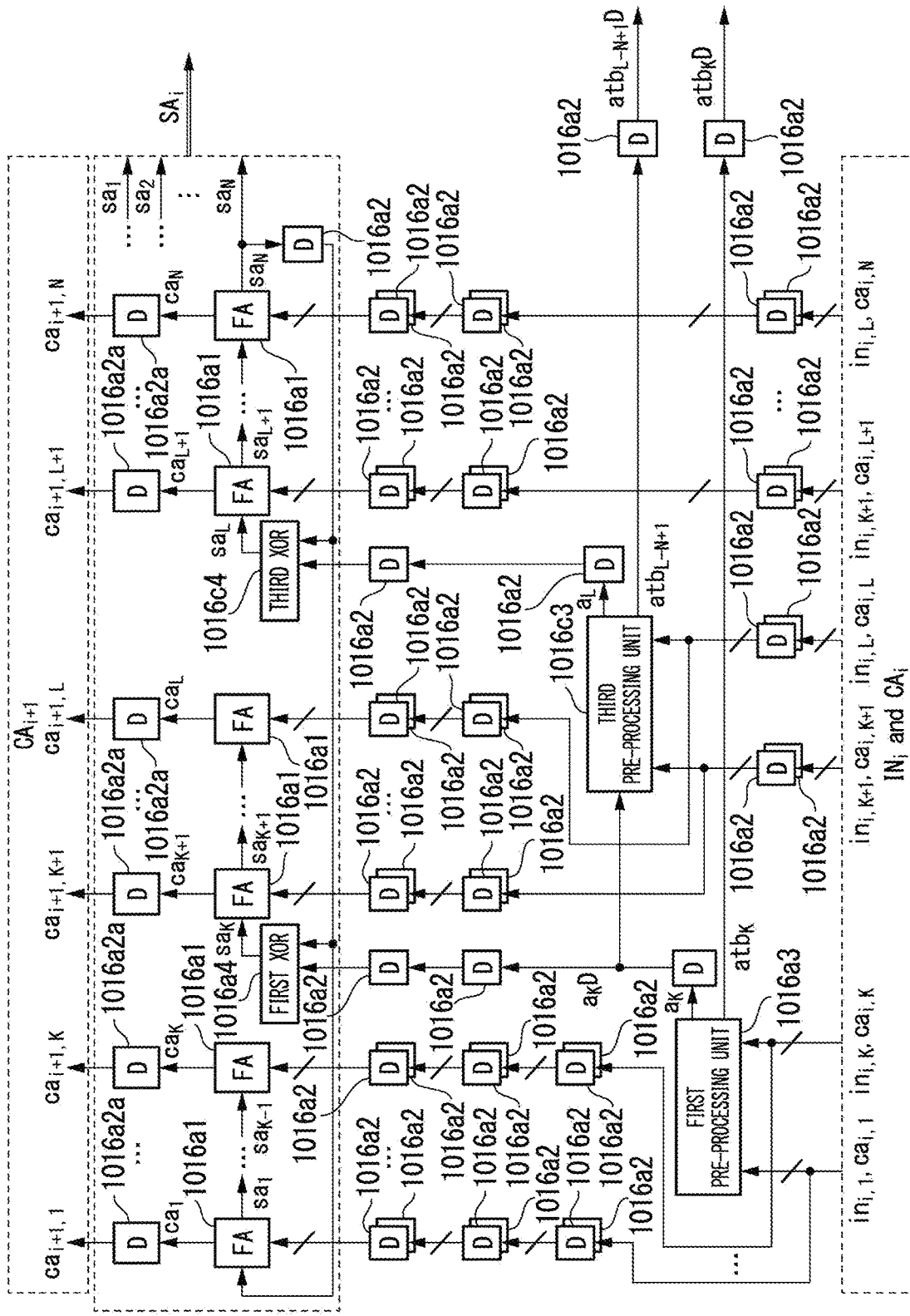
FIG. 11 is a diagram showing a configuration of a preceding stage TI-accumulator according to a fourth example embodiment of the present invention.
Figure 12:
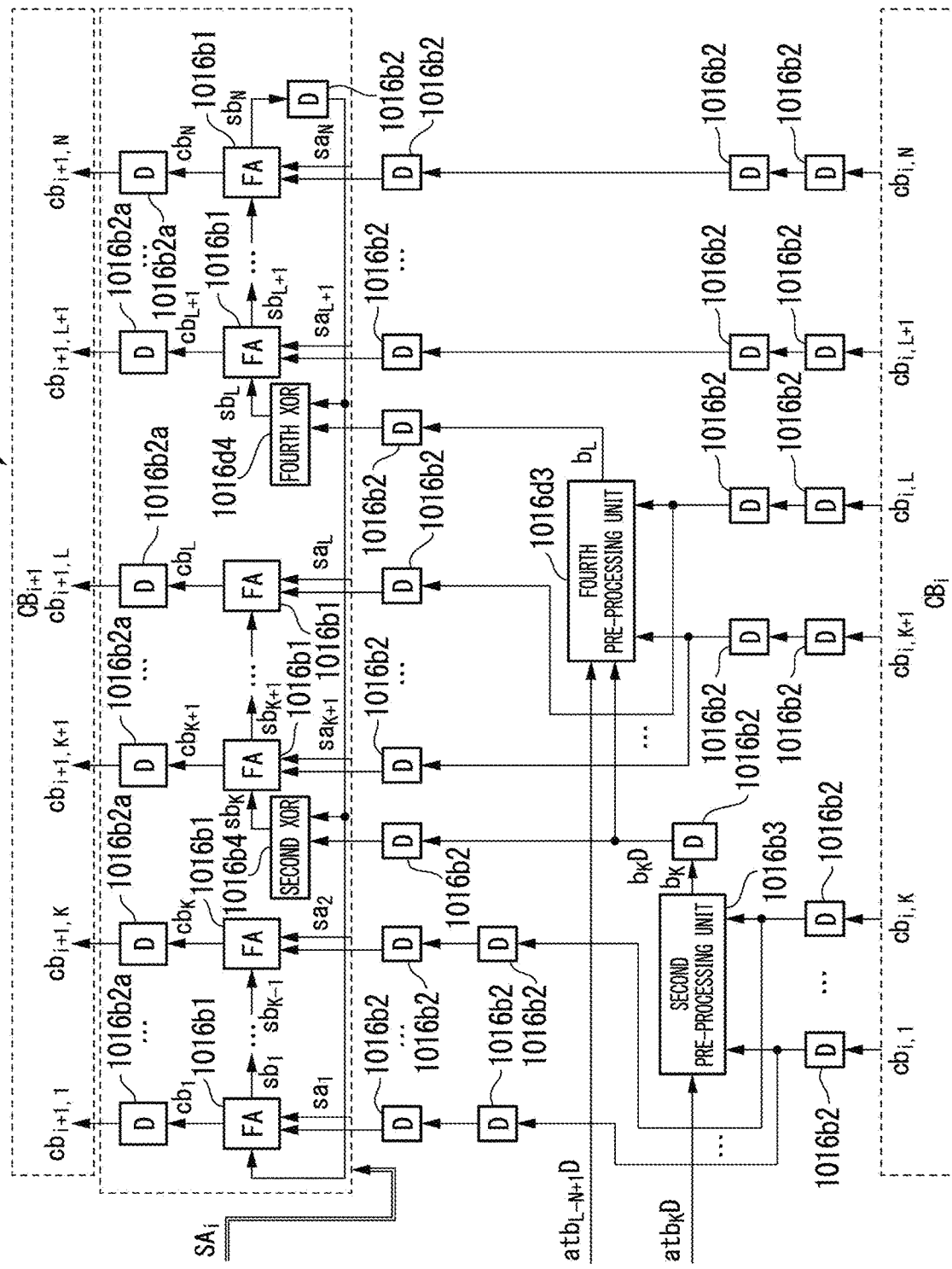
FIG. 12 is a diagram showing a configuration of a subsequent stage TI-accumulator according to the fourth example embodiment of the present invention.

FIG. 11 shows the TI-accumulator 1016a according to the fourth example embodiment of the present invention. Furthermore, FIG. 12 shows the TI-accumulator 1016b according to the fourth example embodiment of the present invention.

First, the TI-accumulator 1016a shown in FIG. 11 will be described.

The TI-accumulator 1016a includes N serially connected FAs 1016a1, (7N+8) delay elements (D) 1016a2, a first pre-processing unit 1016a3 (an example of a first arithmetic operation unit), a third pre-processing unit 1016c3 (an example of a first arithmetic operation unit), a first XOR unit 1016a4, and a third XOR unit 1016a6 (an example of a first arithmetic operation unit).

As shown in FIG. 11, the N FAs 1016a1 are configured by three FA 1016a1 arrays in which the sum bits of the FAs 1016a1 are serially connected. The indexes 1 to N is assigned to the respective FAs 1016a1, which correspond to the indexes of the inputs to the FAs 1016a1. The first FA 1016a1 array (an example of a first sub-adder array) is configured by FAs 1016a1 having indexes 1 to K. The second FA 1016a1 array (an example of an (n−1)th sub-adder array when n is 3) is configured by FAs 1016a1 having indexes (K+1) to L (where L is an integer greater than or equal to (K+2) and less than N). The third FA 1016a1 array (an example of an nth sub-adder array when n is 3) is configured by FAs 1016a1 having indexes (L+1) to N.

Furthermore, a delay element (D) 1016a2 delays the sum bit output (sax) of the last-stage FA 1016a1 of the N FAs 1016a1 to the index N is assigned. Then, the delay element (D) 1016a2 inputs the delayed signal to the first XOR unit 1016a4, the third XOR unit 1016a6, and the first-stage FA 1016a1 to which the index 1 is assigned.

The first pre-processing unit 1016a3 and the first XOR unit 1016a4 according to the fourth example embodiment of the present invention are the same as the first pre-processing unit 1016a3 and the first XOR unit 1016a4 according to the first example embodiment of the present invention.

Figure 13:
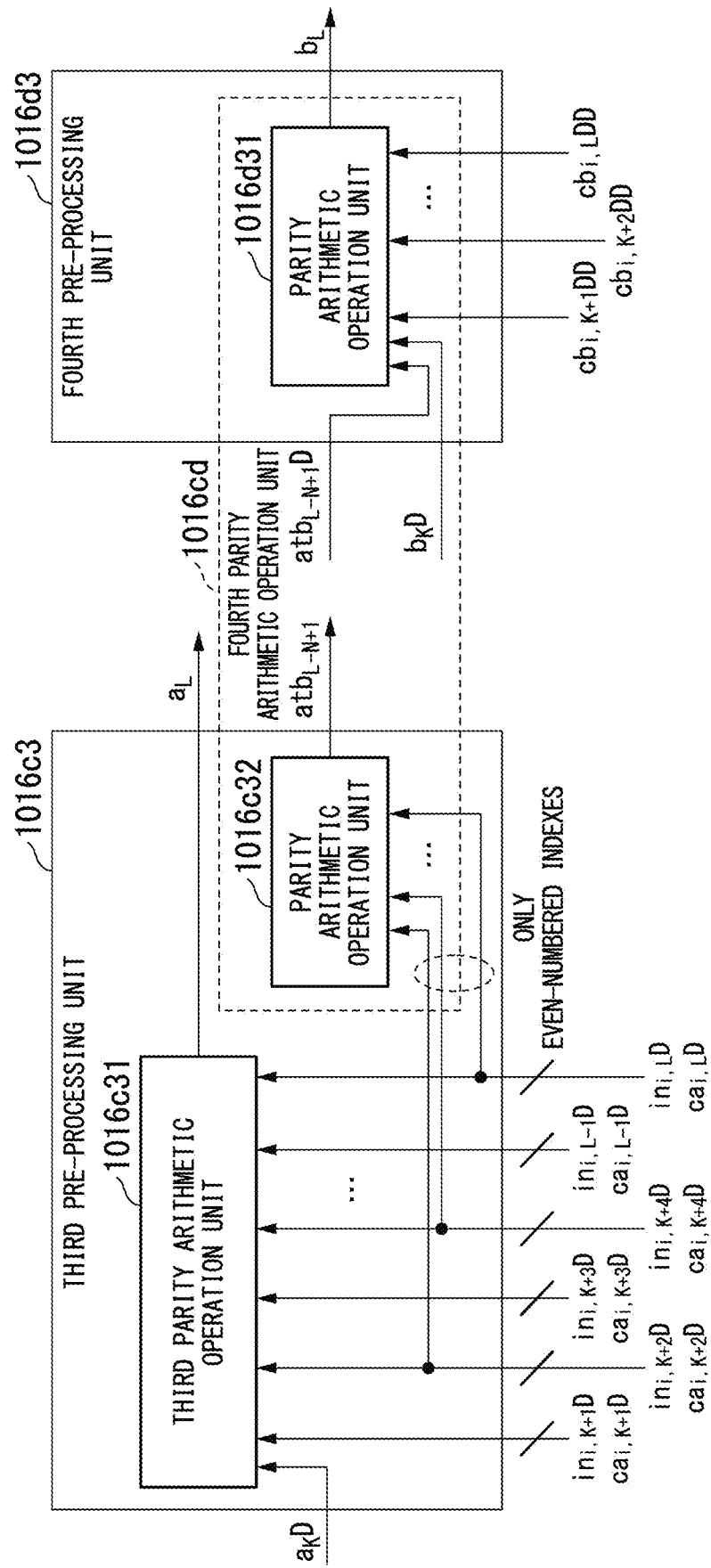
FIG. 13 is a diagram showing a configuration of a third pre-processing unit and a fourth pre-processing unit according to the fourth example embodiment of the present invention.

As shown in FIG. 13, the third pre-processing unit 1016c3 includes a third parity arithmetic operation unit 1016c31 and a parity arithmetic operation unit 1016c32.

The third pre-processing unit 1016c3 receives a 2(L−K)-bit input delayed by one clock which is obtained by, among the input signals $IN_i$ and $CA_i$ to the TI-accumulator 1016a, the respective input signals having indexes from (K+1) to L $(in_{i,K+1}, in_{i,K+2}, \ldots, in_{i,L}, ca_{i,K+1}, ca_{i,K+2}, \ldots, ca_{i,L})$ being delayed by the delay elements (D) 1016a2. Furthermore, along with this, the third pre-processing unit 1016c3 receives, as input signal, a signal $a_kD$, which is obtained by the output $a_k$ of the first parity arithmetic operation unit 1016a31, which is a 1 bit signal, being delayed by one clock.

The third parity arithmetic operation unit 1016a31 performs a parity arithmetic operation with respect to the 2(L−K)-bit input signal received by the third pre-processing unit 1016c3, which excludes the signal $a_kD$, and outputs a single bit $(a_L)$.

The output a of the third parity arithmetic operation unit 1016c31 is delayed by two clocks by two delay elements (D) 1016a2, and then input to the third XOR unit 1016a6. Furthermore, the output $atb_{L-N-1}$ of the parity arithmetic operation unit 1016c32 is delayed by one clock by a delay element (D) 1016a2, and then input to the fourth pre-processing unit 1016d3.

The input of the third parity arithmetic operation unit 1016c31 does not have to use all of the 2(L−K)-bit input signal $(in_{i,K+1}, in_{i,K+2}, \ldots, in_{i,L}, ca_{i,K+1}, ca_{i,K+2}, \ldots, ca_{i,L})$ as described above. Specifically, when the interpolation units 1011a and 1011b use a zero-order hold when performing oversampling, there are cases where consecutive bits have the same values, such as when $in_{i,K+1}=in_{i,K+2}$, $in_{i,K+3}=in_{i,K+4}, \ldots, in_{i,L-1}, in_{i,L}$. In this case, the parity of the (L−K) bits $(in_{i,K+1}, in_{i,K+2}, \ldots, in_{i,L})$ is zero regardless of their values. Consequently, the input of these (L−K) bits $(in_{i,K+1}, in_{i,K+2}, \ldots, in_{i,L})$ can be omitted, such that the input bits become the (L−K) bits of $ca_{i,K+1}, ca_{i,K+2}, \ldots, ca_{i,L}$. Such a configuration where the third parity arithmetic operation unit 1016c31 performs an arithmetic operation while omitting (L−K) bits of the input is also included in example embodiments of the present invention.

The third XOR unit 1016a6 performs an XOR arithmetic operation with respect to two input signals (a delayed signal of the output of the third parity arithmetic operation unit 1016c31 and a delayed signal of the output of the last-stage FA 1016a1). The third XOR unit 1016c4 outputs an arithmetic operation result to the FA 1016a1 having the index (L+1) to which it is serially connected.

The parity arithmetic operation unit 1016c32 performs a parity arithmetic operation using, among the 2(L−K) bits described above, (L−K) bits to which even-numbered indexes $(in_{i,K+2}, in_{i,K+4}, \ldots, ca_{i,K+2}, ca_{i,K+4}, \ldots, ca_{i,L})$ are assigned. The parity arithmetic operation unit 1016c32 outputs an arithmetic operation result as a single bit $(atb_{L-N+1})$. The output $atb_{L-N+1}$ of the parity arithmetic operation unit 1016c32 is, as mentioned above, delayed by one clock by a delay element (D) 1016a2, and then input to the fourth pre-processing unit 1016d3.

Next, the TI-accumulator 1016b shown in FIG. 12 will be described.

As shown in FIG. 12, the TI-accumulator 1016b includes N serially connected FAs 1016b1, (4N+4) delay elements (D) 1016b2, a second pre-processing unit 1016b3, a fourth pre-processing unit 1016d3 (an example of a first arithmetic operation unit), a second XOR unit 1016b4, and a fourth XOR unit 1016c4 (an example of a second arithmetic operation unit).

As shown in FIG. 12, the N FAs 1016b1 included in the TI-accumulator 1016b are configured by three FA 1016b1 arrays in which the sum bits of the FAs 1016b1 are serially connected. Indexes 1 to N are assigned to the respective FAs 1016b1, which correspond to the indexes of the inputs to the FAs 1016b1. The first FA 1016b1 array (an example of an (n+1)th sub-adder array when n is 3) is configured by FAs 1016b1 having indexes 1 to K. The second FA 1016b1 array (an example of a (2n−1)th sub-adder array when n is 3) is configured by FAs 1016b1 having indexes (K+1) to L. The third FA 1016b1 array (an example of a (2n)th sub-adder array when n is 3) is configured by FAs 1016b1 having indexes (L+1) to N.

Furthermore, a delay element (D) 1016b2 delays the sum bit output $(sb_N)$ of the last-stage FA 1016b1 to which the index N is assigned, among the N FAs 1016b1. Then, the delay element (D) 1016b2 inputs the delayed signal to the second XOR unit 1016b4, the fourth XOR unit 1016d4, and the first-stage FA 1016b1 to which the index 1 is assigned.

The second pre-processing unit 1016b3 and the second XOR unit 1016b4 are the same as the second pre-processing unit 1016b3 and the second XOR unit 1016b4 according to the first example embodiment of the present invention.

As shown in FIG. 13, the fourth pre-processing unit 1016d3 includes a parity arithmetic operation unit 1016d31. The parity arithmetic operation unit 1016d31 and the parity arithmetic operation unit 1016c32 together constitute a fourth parity arithmetic operation unit 1016cd.

In the fourth pre-processing unit 1016d3, the parity arithmetic operation unit 1016d31 delays, among the carry bits CB$i$, each of the carry bits ($ca_{i,K+1}$, $ca_{i,K+2}$, . . . , $ca_{i,L}$) having indexes from (K+1) to L (where L is an integer greater than or equal to (K+2) and less than N) by two clocks due to the operation of two delay elements (D) 1016b2 for each bit. The parity arithmetic operation unit 1016d31 receives a total of (L−K+2) bits, which consist of the delayed (L−K)-bit signal $ca_{i,K+1}$DD, $ca_{i,K+2}$DD, . . . , $ca_{i,L}$DD, a one-bit signal $atb_{L-N+1}$ representing the output $atb_{L-N+1}$ of the third pre-processing unit 1016c3 delayed by one clock by a delay element (D) 1016b2, and a one-bit signal $b_K$D representing the output $b_K$ of the second pre-processing unit 1016b3 delayed by one clock by a delay element (D) 1016b2. The parity arithmetic operation unit 1016d31 performs a parity arithmetic operation with respect to the input signals. The parity arithmetic operation unit 1016c31 outputs an arithmetic operation result as a single bit ($b_L$).

The fourth XOR unit 1016d4 performs an XOR arithmetic operation with respect to two input signals (a delayed signal of the output of the parity arithmetic operation unit 1016d31 and a delayed signal of the output of the last-stage FA 1016b1). The fourth XOR unit 1016d4 outputs the arithmetic operation result to the FA 1016a1 having the index (L+1) to which it is serially connected.

Figure 14:
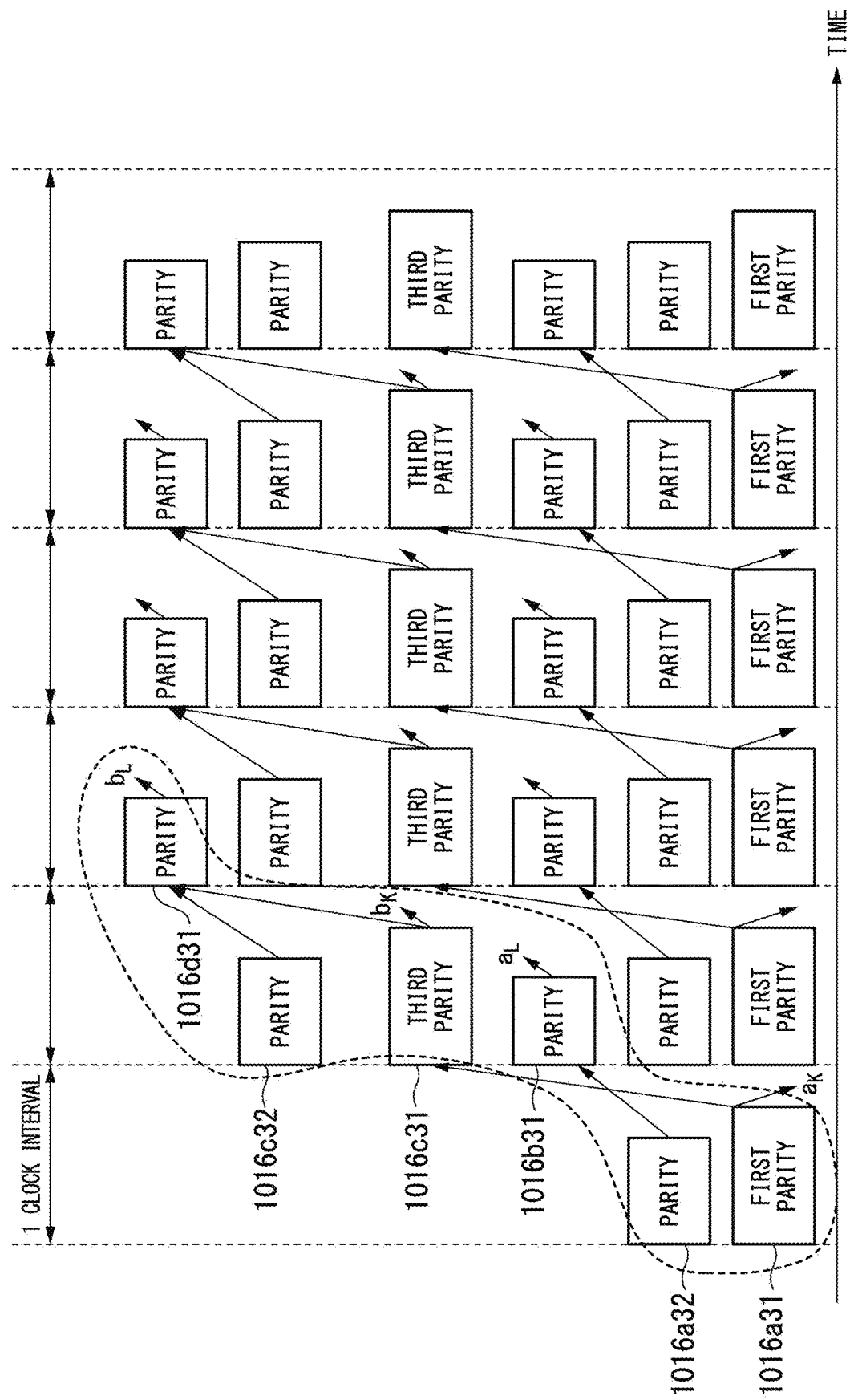
FIG. 14 is a first time chart showing an operation of a digital modulator according to the fourth example embodiment of the present invention.

FIG. 14 is a time chart showing an operation of the digital modulator 101. Hereunder, the time chart shown in FIG. 14 will be described.

FIG. 14 shows the timings at which each of the first parity arithmetic operation unit 1016a31, the second parity arithmetic operation unit 1016ab, the third parity arithmetic operation unit 1016ab2, and the fourth parity arithmetic operation unit 1016cd outputs an output signal.

On the first clock, the output $a_K$ of the first parity arithmetic operation unit 1016a31 and the output $atb_K$ of the parity arithmetic operation unit 1016a32 are obtained.

On the second clock, the first parity arithmetic operation unit 1016b31 executes a parity arithmetic operation with respect to the output $atb_K$D, which represents the output $atb_K$ of the parity arithmetic operation unit 1016a32 delayed by one clock by a delay elements (D) 1016b2, and outputs an output signal $b_K$. Furthermore, at the same time, the third parity arithmetic operation unit 1016c31 and the parity arithmetic operation unit 1016c32 execute a parity arithmetic operation. Then, the third parity arithmetic operation unit 1016c31 outputs an output signal at, and the parity arithmetic operation unit 1016c32 outputs an output signal $atb_{L-K+1}$.

Then, on the third clock, the parity arithmetic operation unit 1016d31 performs a parity arithmetic operation with respect to the output signal $atb_{L-K+1}$ of the parity arithmetic operation unit 1016c32, and outputs an output signal $b_L$.

Figure 15:
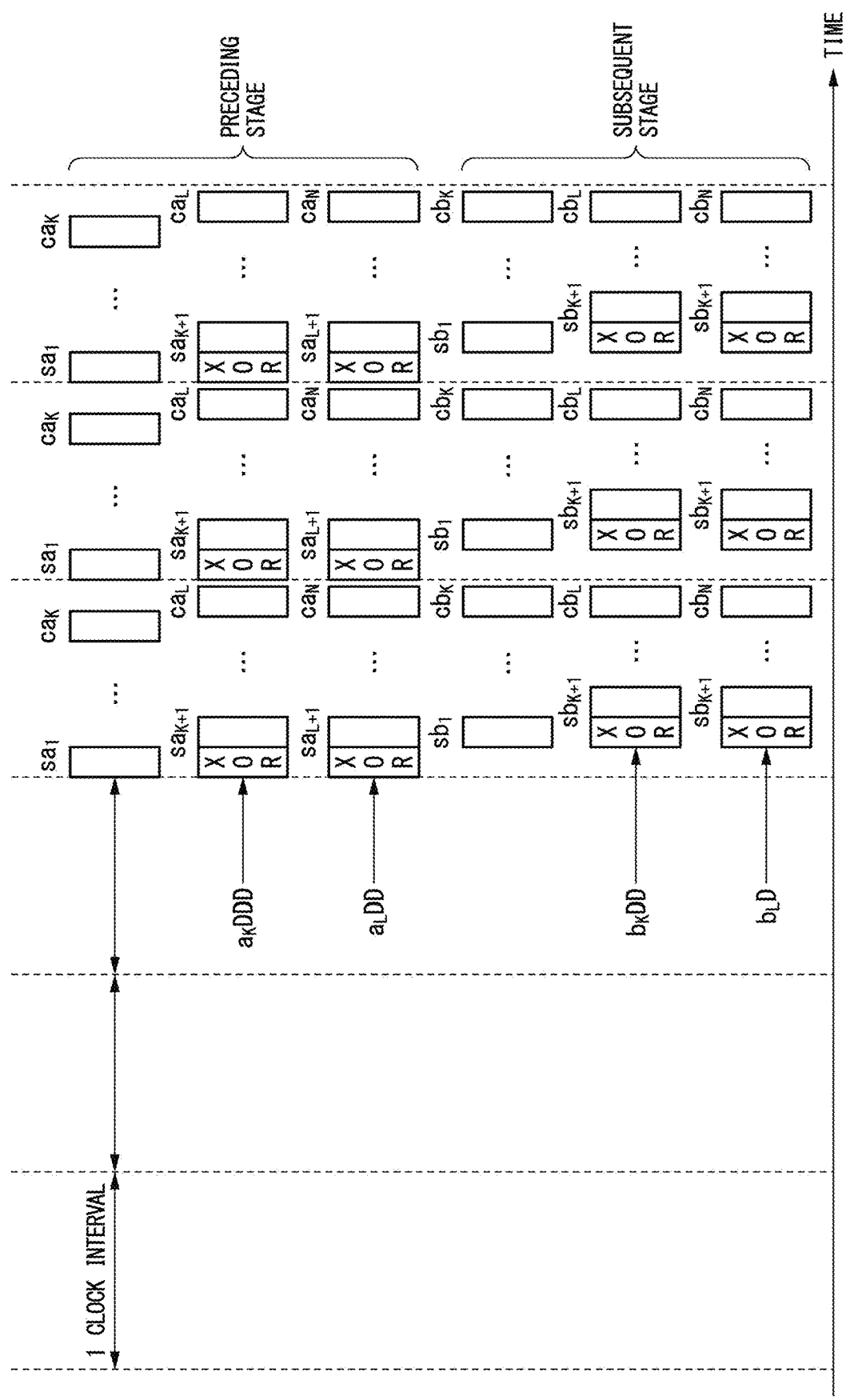
FIG. 15 is a second time chart showing an operation of a digital modulator according to the fourth example embodiment of the present invention.

FIG. 15 shows a time chart of a case where after the timings of the respective output signals $a_K$, $b_K$, $a_L$, and $b_L$ is adjusted by delay elements (D) 1016b2, the adjusted signals are input to the first XOR unit 1016a4, the second XOR unit 1016b4, the third XOR unit 1016c4, and the fourth XOR unit 1016d4.

In the radio 1 according to the fourth example embodiment of the present invention, the sum bits between the FAs 1016a1 of the TI-accumulator 1016a and the FAs 1016b1 of the TI-accumulator 1016b can be used as input signals of the first XOR unit 1016a4, the second XOR unit 1016b4, the third XOR unit 1016c4, and the fourth XOR unit 1016d4. As a result, the radio 1 according to the fourth example embodiment of the present invention is capable of executing three arithmetic operations in parallel (first to Kth, (K+1)th to Lth, and (L+1)th to Nth) in both the TI-accumulator 1016a and the TI-accumulator 1016b. This enables communication at higher speeds than in the radio 1 according to the first to the third example embodiments of the present invention.

In the fourth example embodiment of the present invention, in a case where the signals to which odd-numbered indexes are assigned are split and subjected to arithmetic operation processing in parallel, the radio 1 may perform a parity arithmetic operation and carry out communication by applying the same modifications as described in the first to third example embodiments of the present invention.

The radio 1 according to the fourth example embodiment of the present invention has been described above.

In the radio 1, the digital modulator 101 includes a fifth adder array (an adder array of the FAs 1016a1 to which the indexes (K+1) to L are assigned). The digital modulator 101 includes a sixth adder array (an adder array of the FAs 1016b1 to which the indexes (K+1) to L are assigned). The digital modulator 101 includes the first pre-processing unit 1016a3, which performs an arithmetic operation on the basis of inputs supplied to the plurality of adders of the first adder array. The digital modulator 101 includes the first XOR unit 1016a4, which performs an arithmetic operation on the basis of an arithmetic operation result of the first pre-processing unit 1016a3 and an output of the second adder array, and inputs an arithmetic operation result to the fifth adder array. The digital modulator 101 includes the third pre-processing unit 1016c3, which performs an arithmetic operation on the basis of an arithmetic operation result of the first pre-processing unit 1016a3, and inputs an arithmetic operation result to the third XOR unit 1016c4. The digital modulator 101 includes the third XOR unit 1016c4, which performs an arithmetic operation on the basis of an arithmetic operation result of the third pre-processing unit 1016c3 and an output of the second adder array, and inputs an arithmetic operation result to the second adder array. The digital modulator 101 includes the second pre-processing unit 1016b3, which performs an arithmetic operation on the basis of inputs supplied to the plurality of adders of the first adder array, and inputs supplied to the plurality of adders of the third adder array. The digital modulator 101 includes the second XOR unit 1016b4, which performs an arithmetic operation on the basis of an arithmetic operation result of the second pre-processing unit 1016b3, and an output of the fourth adder array, and inputs an arithmetic operation result to the sixth adder array. The digital modulator 101 includes the fourth pre-processing unit 1016d3, which performs an arithmetic operation on the basis of an arithmetic operation result of the second pre-processing unit 1016b3, and inputs an arithmetic operation result to the fourth XOR unit 1016d4. The digital modulator 101 includes the second XOR unit 1016b4, which performs an arithmetic operation on the basis of an arithmetic operation result of the fourth pre-processing unit 1016d3, and an output of the fourth adder array, and inputs an arithmetic operation result to the fourth adder array.

As a result of the digital modulator 101 being configured in this manner, the amount of parallel processing per unit time can be increased compared to the radio 1 of the first to third example embodiments of the present invention. Further, a shorter processing time than the processing time of the radio 1 of the first to third example embodiments of the present invention can be realized.

In the fourth example embodiment of the present invention, a configuration of the radio 1 including three FA 1016a1 arrays and three FA 1016b1 arrays (that is to say, the case where n is 3) has been presented as an example. However, the radio 1 according to another example embodiment of the present invention may be configured to include n FA 1016a1 arrays and n FA 1016b1 arrays (that is to say, n may be an arbitrary integer greater than or equal to 4).

OTHER EXAMPLE EMBODIMENT

Figure 16:
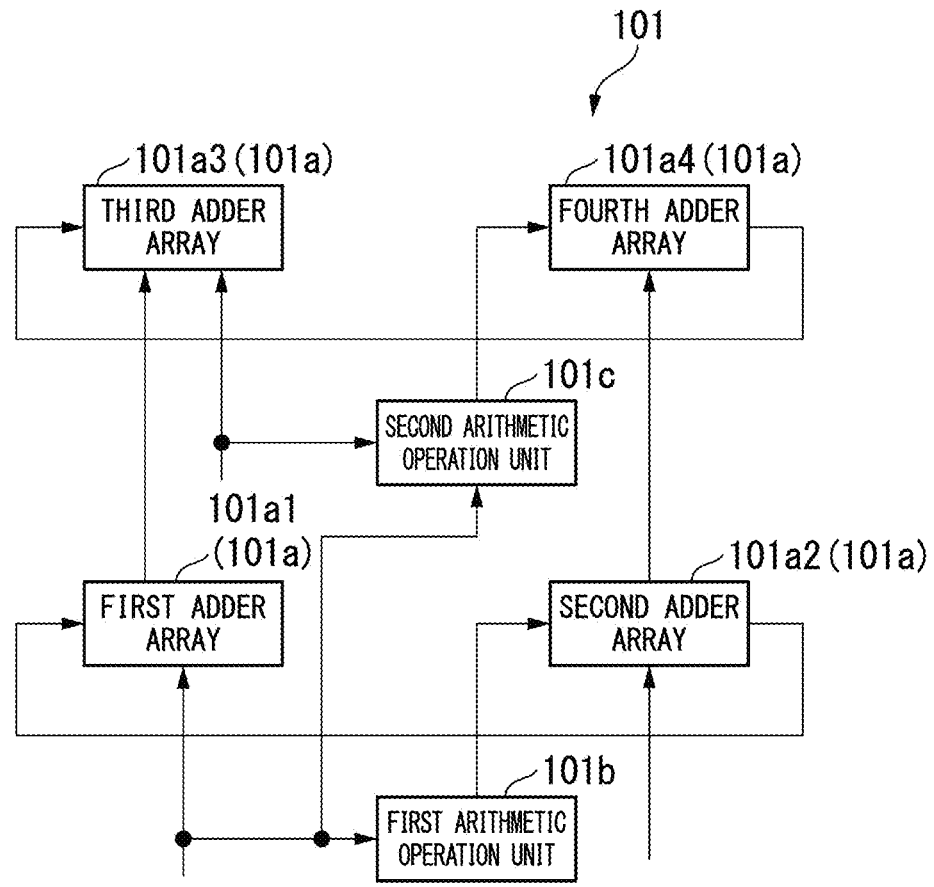
FIG. 16 is a diagram showing a digital modulator according to an example embodiment of the present invention.

As shown in FIG. 16, the digital modulator 101 according to another example embodiment of the present invention includes a two-stage integrator 101a, a first arithmetic operation unit 101b, and a second arithmetic operation unit 101c. The digital modulator 101 shown in FIG. 16 represents a digital modulator according to the other example embodiment of the present invention.

The two-stage integrator 101a includes a plurality of adder arrays each of which includes a plurality of adders. The adder arrays include a first adder array 101a1, a second adder array 101a2, a third adder array 101a3, and a fourth adder array 101a4.

The two-stage integrator 101a feeds back an output of the second adder array 101a2 to an input of the first adder array 101a1.

The two-stage integrator 101a feeds back an output of the fourth adder array 101a4 to an input of the third adder array 101a3.

The two-stage integrator 101a inputs a sum bit string obtained in the first adder array 101a1 is input to the third adder array 101a3.

The two-stage integrator 101a inputs a sum bit string obtained in the second adder array 101a2 to the fourth adder array 101a4.

The first arithmetic operation unit 101b performs an arithmetic operation on the basis of inputs supplied to the plurality of adders of the first adder array 101a1, and inputs an arithmetic operation result to the second adder array 101a2.

The second arithmetic operation unit 101c performs an arithmetic operation on the basis of inputs supplied to the plurality of adders of the first adder array 101a1 and inputs supplied to the plurality of adders of the third adder array 101a3, and inputs an arithmetic operation result to the fourth adder array 101a4.

According to such a digital modulator 101, a target signal of an arithmetic operation can be subjected to an arithmetic operation by the second arithmetic operation unit 101c in parallel with the first arithmetic operation unit 101b. Therefore, arithmetic operations can be performed at high speeds.

In a case where the signals to which odd-numbered indexes are assigned are split, the radio 1 according to the second example embodiment of the present invention may be modified in the same manner as the radio 1 according to the third example embodiment of the present invention, such that the TI-accumulators 1016a and the TI-accumulators 1016b perform arithmetic operations in parallel.

In the processing according to the example embodiments of the present invention, the order of the processing may be switched within a range in which appropriate processing is performed.

The storage units and the other storage devices in the example embodiments of the present invention may each be provided anywhere, as long as appropriate information is transmitted and received. The plurality of storage units and other storage devices may each be included so as to store data in a distributed fashion, as long as appropriate information is transmitted and received.

Although example embodiments of the present invention have been described, the digital modulator 101 described above and the other control devices may include a computer system therein. Further, the steps of the processing described above are stored in a computer-readable recording medium in the form of a program, and the processing is performed as a result of a computer reading and executing the program. A specific example of a computer is presented below.

Figure 17:
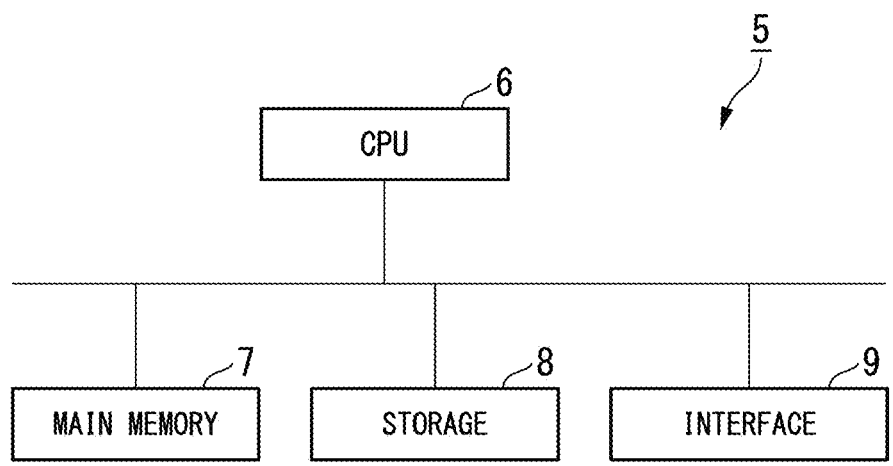
FIG. 17 is a schematic block diagram showing a configuration of a computer according to at least one example embodiment.
Figure 18:
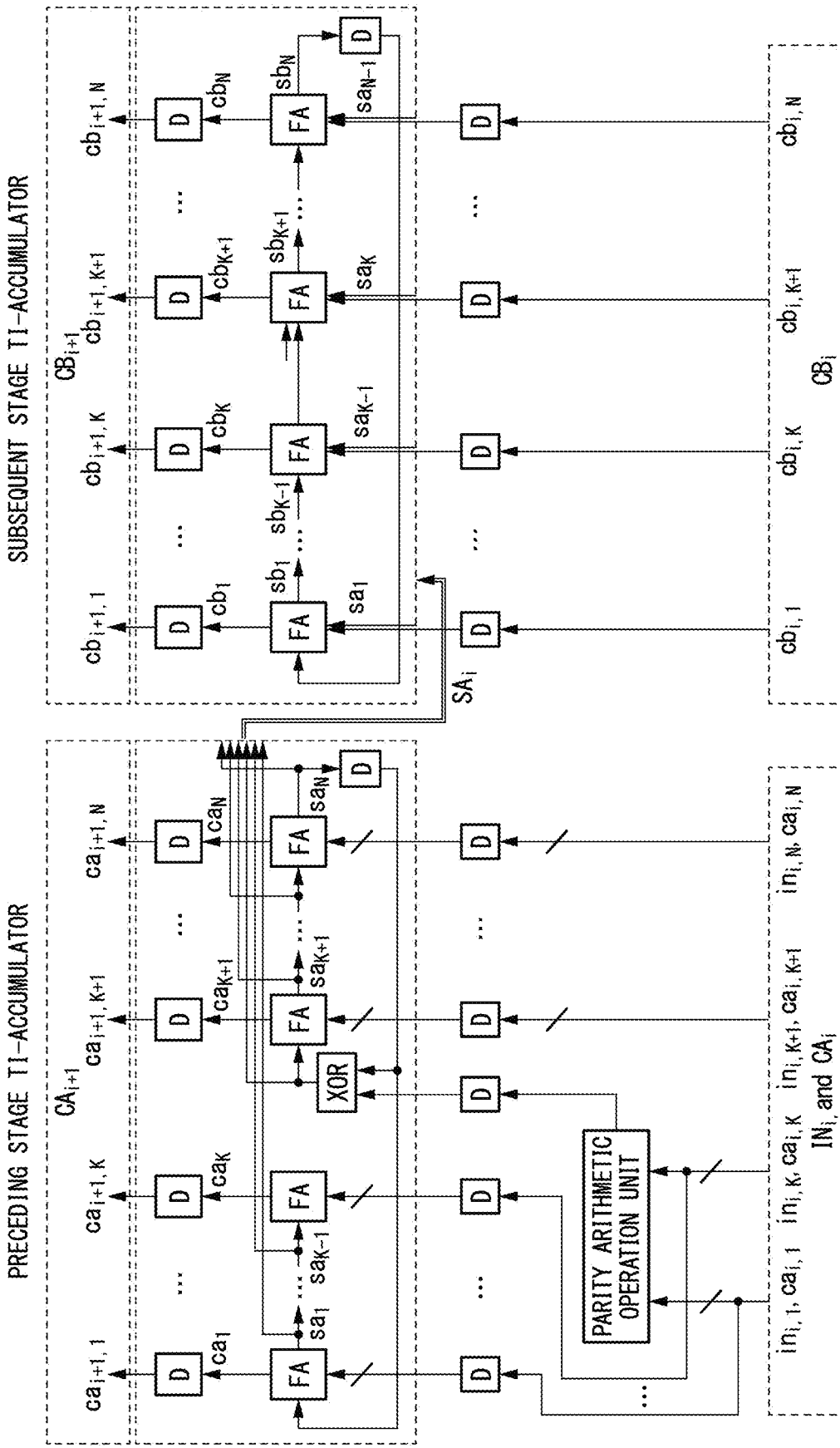
FIG. 18 is a first diagram for illustrating a problem.
Figure 19:
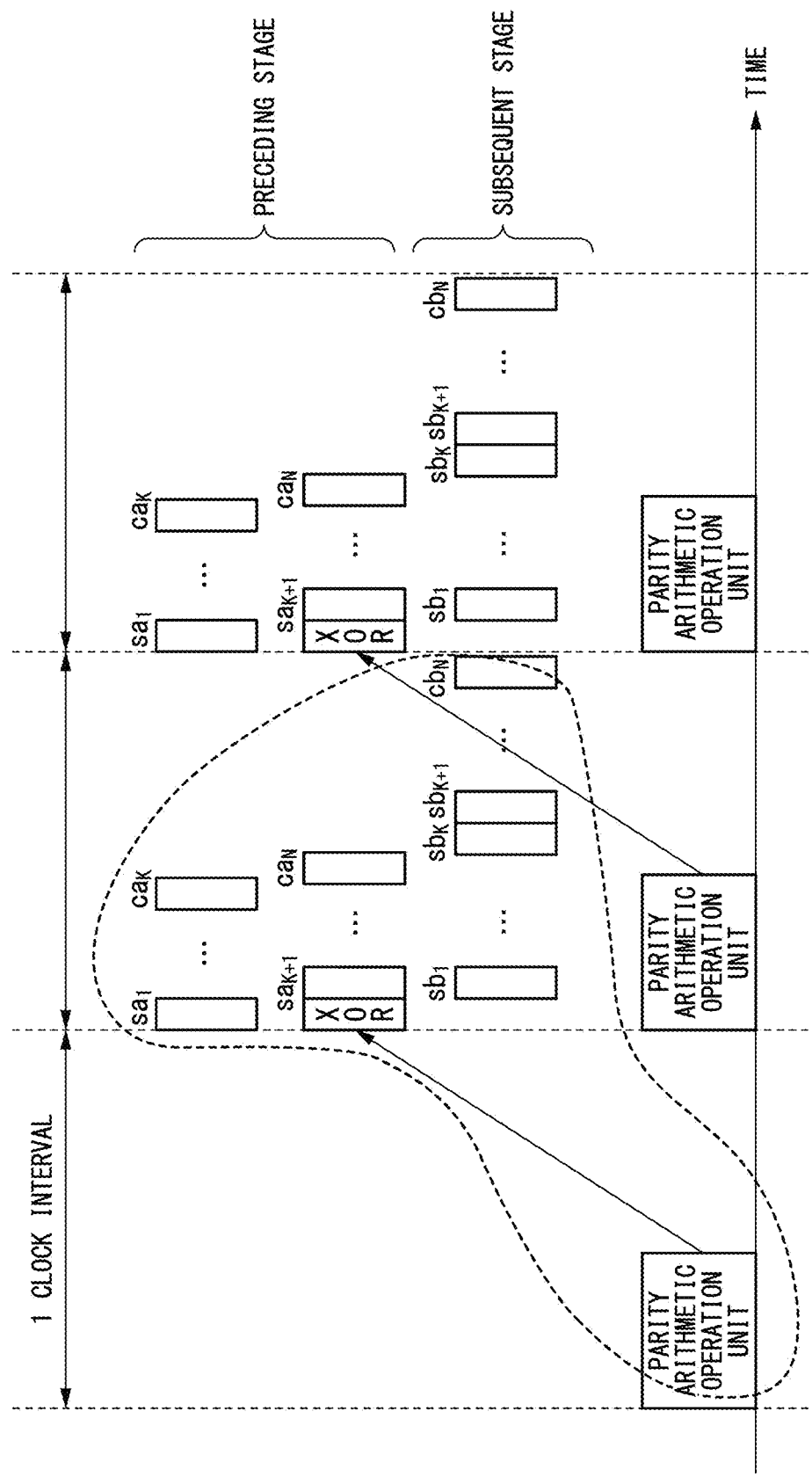
FIG. 19 is a second diagram for illustrating the problem.

FIG. 17 is a schematic block diagram showing a configuration of a computer according to at least one example embodiment.

As shown in FIG. 17, the computer 5 includes a CPU 6, a main memory 7, a storage 8, and an interface 9.

For example, the digital modulator 101 described above and the other control devices are each implemented by the computer 5. Further, the operation of each of the processing units described above is stored in the storage 8 in a program format. The CPU 6 reads the program from the storage 8, loads the program in the main memory 7, and executes the processing described above according to the program. Moreover, the CPU 6 secures a storage area corresponding to each of the storage units described above in the main memory 7 according to the program.

Examples of the storage 8 include an HDD (Hard Disk Drive), an SSD (Solid State Drive), a magnetic disk, a magneto-optical disk, a CD-ROM (Compact Disc Read Only Memory), a DVD-ROM (Digital Versatile Disc Read Only Memory), and a semiconductor memory. The storage 8 may be an internal medium directly connected to the bus of the computer 5, or an external medium connected to the computer 5 via the interface 9 or a communication line. Furthermore, when the program is distributed to the computer 5 via a communication line, the computer 5 that receives the program may load the program into the main memory 7, and execute the processing described above. In at least one example embodiment, the storage 8 is a non-transitory tangible storage medium.

In addition, the program may realize some of the functions described above. Further, the program may be one that realizes the functions mentioned above by being combined with a program already recorded on the computer system, as a so-called difference file (difference program).

Although several example embodiments of the present invention have been described, these example embodiments are examples and do not limit the scope of the invention. In these example embodiments, various additions, omissions, replacements, and changes may be made without departing from the spirit of the invention.

This application is based upon and claims the benefit of priority from Japanese Patent Application No. 2017-232802, filed Dec. 4, 2017, the disclosure of which is incorporated herein in its entirety.

INDUSTRIAL APPLICABILITY

The present invention may be applied to a second-order ΔΣ modulator, a radio, and a signal processing method performed by a second-order ΔΣ modulator.

REFERENCE SYMBOLS

1 Radio
5 Computer
6 CPU
7 Main memory
8 Storage
9 Interface
10 Transmitter
20 Receiver
101 Digital modulator
102 Class D amplifier
103 Band pass filter
104 Antenna
1011a, 1011b Interpolation unit
1012a, 1012b TI (time interleaved)-ΔΣ modulation units
1013 Digital up converter
1014 Serializer
1015 Delay unit
1016 TI-two stage accumulator
1016a, 1016b TI-accumulator
1016a1, 1016b1 FA (full adder)
1016a2, 1016b2 Delay element (D)
1016a3 First pre-processing unit
1016a4 First XOR unit
1016a31 First parity arithmetic operation unit
1016a32, 1016b31 Parity arithmetic operation unit
1016ab Second parity arithmetic operation unit
1016b3 Second pre-processing unit
1016b4 Second XOR unit
1017 N serially connected channel bit arithmetic operation unit

The invention claimed is:

1. A second-order ΔΣ (delta sigma) modulator comprising:
 a two-stage integrator;
 a first arithmetic operation circuit; and
 a second arithmetic operation circuit,
 wherein the two-stage integrator comprises a plurality of adder arrays, each of the plurality of adder arrays comprises a plurality of adders,
 the plurality of adder arrays comprises a first adder array, a second adder array, a third adder array, and a fourth adder array,
 an output of a last stage of the second adder array is fed back as an input of a first stage of the first adder array,
 an output of a last stage of the fourth adder array is fed back as an input of a first stage of the third adder array,
 a sum bit string obtained in the first adder array is input to the third adder array,
 a sum bit string obtained in the second adder array is input to the fourth adder array,
 the first arithmetic operation circuit performs an arithmetic operation based on inputs supplied to the plurality of adders of the first adder array, and inputs an arithmetic operation result to the second adder array, and
 the second arithmetic operation circuit performs an arithmetic operation based on the inputs supplied to the plurality of adders of the first adder array and inputs supplied to the plurality of adders of the third adder array, and inputs an arithmetic operation result to the fourth adder array.

2. The second-order ΔΣ modulator according to claim 1, wherein the first arithmetic operation circuit comprises:
 a first parity arithmetic operation circuit that performs an arithmetic operation based on the inputs supplied to the plurality of adders of the first adder array; and
 a first XOR (Exclusive OR) circuit that performs an arithmetic operation based on an arithmetic operation result of the first parity arithmetic operation circuit and the output of the second adder array, and inputs an arithmetic operation result to the second adder array, and
the second arithmetic operation circuit comprises:
 a second parity arithmetic operation circuit that performs an arithmetic operation based on the inputs supplied to the plurality of adders of the first adder array and the inputs supplied to the plurality of adders of the third adder array; and
 a second XOR circuit that performs an arithmetic operation based on an arithmetic operation result of the second parity arithmetic operation circuit and the output of the fourth adder array, and inputs an arithmetic operation result to the fourth adder array.

3. The second-order ΔΣ modulator according to claim 1, wherein the first arithmetic operation circuit comprises:
 a first parity arithmetic operation circuit that performs an arithmetic operation based on the inputs supplied to the plurality of adders of the first adder array; and
 a first XOR (Exclusive OR) circuit that performs an arithmetic operation based on an arithmetic operation result of the first parity arithmetic operation circuit and the output of the second adder array, and inputs an arithmetic operation result to the second adder array, and
the second arithmetic operation circuit comprises:
 a second parity arithmetic operation circuit that performs an arithmetic operation based on the inputs supplied to the plurality of adders of the first adder array, and the inputs supplied to the plurality of adders of the third adder array; and
 a third XOR circuit that performs an arithmetic operation based on an arithmetic operation result of the second parity arithmetic operation circuit, the output of the fourth adder array, and the output of the second adder array, and inputs an arithmetic operation result to the second adder array.

4. The second-order ΔΣ modulator according to claim 1, further comprising:
 a first delay circuit that delays the output of the second adder array; and
 a second delay circuit that delays the output of the fourth adder array,
 wherein the first arithmetic operation circuit comprises:
 a first parity arithmetic operation circuit that performs an arithmetic operation based on the inputs supplied to the plurality of adders of the first adder array;
 a third delay circuit that delays an arithmetic operation result output by the first parity arithmetic operation circuit; and
 a fourth XOR (Exclusive OR) circuit that performs an arithmetic operation based on an output of the third delay circuit and an output of the first delay circuit, and inputs an arithmetic operation result to the second adder array, and the second arithmetic operation circuit comprises:
a third parity arithmetic operation circuit that performs an arithmetic operation based on the inputs supplied to the plurality of adders of the first adder array; and
a fourth delay circuit that delays an arithmetic operation result output by the third parity arithmetic operation circuit;
a fourth parity arithmetic operation circuit that performs an arithmetic operation based on an output of the fourth delay circuit and the inputs supplied to the plurality of adders of the third adder array;
a fifth delay circuit that delays an arithmetic operation result output by the fourth parity arithmetic operation circuit; and
a fifth XOR circuit that performs an arithmetic operation based on an output of the fifth delay circuit and an output of the second delay circuit, and inputs an arithmetic operation result to the fourth adder array.

5. The second-order $\Delta\Sigma$ modulator according to claim 1, wherein the second adder array comprises p sub-adder arrays that are from a first sub-adder array to a pth sub-adder array, where p is an integer greater than or equal to 2, and that comprise a portion of the plurality of adders of the second adder array,
the fourth adder array comprises p sub-adder arrays that are from a (p+1)th sub-adder array to a (2p)th sub-adder array and that comprise a portion of the plurality of adders of the fourth adder array,
the first arithmetic operation circuit comprises: a plurality of parity arithmetic operation circuits that comprise a first to an mth parity arithmetic operation circuit, where m is an integer greater than or equal to 2, and less than or equal to p; and a plurality of XOR circuits that comprise a first to an mth XOR (Exclusive OR) circuit,
the first parity arithmetic operation circuit performs an arithmetic operation based on inputs supplied to a plurality of adders of the first sub-adder array,
the first XOR circuit performs an arithmetic operation based on an arithmetic operation result of the first parity arithmetic operation circuit and an output of the pth sub-adder array, and inputs an arithmetic operation result to the second sub-adder array,
the mth parity arithmetic operation circuit performs an arithmetic operation based on an arithmetic operation result of the (m-1)th parity arithmetic operation circuit, and inputs an arithmetic operation result to the mth XOR circuit,
the mth XOR circuit performs an arithmetic operation based on an arithmetic operation result of the mth parity arithmetic operation circuit and the output of the pth sub-adder array, and the mth XOR circuit inputs an arithmetic operation result to the (m+1)th sub-adder array when m is not equal to p,
the second arithmetic operation circuit comprises: a plurality of parity arithmetic operation circuits that comprise a (p+1)th to a kth parity arithmetic operation circuit, where k is an integer greater than or equal to p+2, and less than or equal to 2p; and a plurality of XOR circuits that comprise a (p+1)th to a kth XOR circuit,
the (p+1)th parity arithmetic operation circuit performs an arithmetic operation based on the inputs supplied to the plurality of adders of the first sub-adder array, and inputs supplied to a plurality of adders of the (p+1)th sub-adder array,
the (p+1)th XOR circuit performs an arithmetic operation based on an arithmetic operation result of the (p+1)th parity arithmetic operation circuit and an output of the (2p)th sub-adder array, and inputs an arithmetic operation result to the (p+2)th sub-adder array,
the kth parity arithmetic operation circuit performs an arithmetic operation based on an arithmetic operation result of the (k−1)th parity arithmetic operation circuit, and inputs an arithmetic operation result to the kth XOR circuit, and
the kth XOR circuit performs an arithmetic operation based on an arithmetic operation result of the kth parity arithmetic operation circuit and an output of the (2p)th sub-adder array, and the kth XOR circuit inputs an arithmetic operation result to the (k+1)th sub-adder array when k is not equal to 2p.

6. A radio comprising:
a transmitter comprising the second-order $\Delta\Sigma$ modulator according to claim 1; and
a receiver that demodulates a signal modulated by another radio that comprises a transmitter similar to the transmitter.

7. A signal processing method performed by a second-order $\Delta\Sigma$ (delta sigma) modulator, the second-order $\Delta\Sigma$ modulator comprising a two-stage integrator, a first arithmetic operation circuit, and a second arithmetic operation circuit, the two-stage integrator comprising a plurality of adder arrays that comprise a first adder array, a second adder array, a third adder array, and a fourth adder array, each of the plurality of adder arrays comprising a plurality of adders, the method comprising:
feeding back an output of a last stage of the second adder array as an input of a first stage of the first adder array;
feeding back an output of a last stage of the fourth adder as an input of a first stage of the third adder array;
inputting a sum bit string obtained in the first adder array to the third adder array;
inputting a sum bit string obtained in the second adder array to the fourth adder array;
performing an arithmetic operation based on inputs supplied to the plurality of adders of the first adder array to input an arithmetic operation result to the second adder array, by the first arithmetic operation circuit; and
performing an arithmetic operation based on the inputs supplied to the plurality of adders of the first adder array and inputs supplied to the plurality of adders of the third adder array to input an arithmetic operation result to the fourth adder array, by the second arithmetic operation circuit.

* * * * *